(12) United States Patent
Komori et al.

(10) Patent No.: US 11,719,746 B2
(45) Date of Patent: Aug. 8, 2023

(54) SEMICONDUCTOR INSPECTION DEVICE

(71) Applicant: Hitachi High-Tech Corporation, Tokyo (JP)

(72) Inventors: Masaaki Komori, Tokyo (JP); Katsuo Oki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 204 days.

(21) Appl. No.: 17/256,083

(22) PCT Filed: Jun. 28, 2018

(86) PCT No.: PCT/JP2018/024678
§ 371 (c)(1),
(2) Date: Dec. 24, 2020

(87) PCT Pub. No.: WO2020/003458
PCT Pub. Date: Jan. 2, 2020

(65) Prior Publication Data
US 2021/0270891 A1 Sep. 2, 2021

(51) Int. Cl.
*G01R 31/307* (2006.01)
*G01R 31/28* (2006.01)
*G01R 31/311* (2006.01)

(52) U.S. Cl.
CPC ....... *G01R 31/307* (2013.01); *G01R 31/2882* (2013.01); *G01R 31/311* (2013.01)

(58) Field of Classification Search
None
See application file for complete search history.

(56) References Cited

U.S. PATENT DOCUMENTS

| 6,614,244 B2 | 9/2003 | Yamada et al. |
| 8,558,173 B2 * | 10/2013 | Nozoe .................... G01N 23/20 250/311 |

(Continued)

FOREIGN PATENT DOCUMENTS

| EP | 1 480 034 B1 | 8/2006 |
| JP | 2-157665 A | 6/1990 |

(Continued)

OTHER PUBLICATIONS

International Search Report (PCT/ISA/210) issued in PCT Application No. PCT/JP2018/024678 dated Aug. 28, 2018 with English translation (five (5) pages).

(Continued)

*Primary Examiner* — Jermele M Hollington
(74) *Attorney, Agent, or Firm* — Crowell & Moring LLP

(57) ABSTRACT

A semiconductor inspection device capable of detecting an abnormality with high sensitivity in a failure analysis of a fine-structured device is provided. An electron optical system radiates an electron beam to a sample on a sample stage. A measurement device measures an output from a measurement probe that is in contact with the sample. An information processing device starts and stops the radiation of the electron beam to the sample, sets a first measurement period in which the measurement device measures the output from the measurement probe during the radiation and a second measurement period in which the measurement device measures the output from the measurement probe after the radiation, and obtains the measurement value of the output from the measurement probe based on a difference between a first measurement value measured in the first measurement period and a second measurement value measured in the second measurement period.

17 Claims, 14 Drawing Sheets

(56) References Cited

U.S. PATENT DOCUMENTS

| | | | |
|---|---|---|---|
| 10,923,404 B2* | 2/2021 | Suzuki | H01L 22/12 |
| 2001/0022345 A1 | 9/2001 | Ishimoto | |
| 2005/0140379 A1 | 6/2005 | Furukawa et al. | |
| 2008/0135754 A1 | 6/2008 | Eto | |
| 2008/0203297 A1 | 8/2008 | Obuki et al. | |
| 2011/0215812 A1 | 9/2011 | Norimatsu | |
| 2018/0113165 A1* | 4/2018 | Sakamoto | G01R 31/2891 |
| 2019/0152595 A1* | 5/2019 | Mitchell | B64C 39/024 |

FOREIGN PATENT DOCUMENTS

| | | |
|---|---|---|
| JP | 2001-156136 A | 6/2001 |
| JP | 2002-176088 A | 6/2002 |
| JP | 2002-310954 A | 10/2002 |
| JP | 2004-146802 A | 5/2004 |
| JP | 2004-296771 A | 10/2004 |
| JP | 2005-210067 A | 8/2005 |
| JP | 2008-41757 A | 2/2008 |
| JP | 2008-166702 A | 7/2008 |
| JP | 2008-204775 A | 9/2008 |
| JP | 2009-117774 A | 5/2009 |
| JP | 4467588 B2 | 5/2010 |
| JP | 2010-135684 A | 6/2010 |
| JP | 2011-185633 A | 9/2011 |
| JP | 2013-187510 A | 9/2013 |
| TW | 200712516 | 4/2007 |
| TW | 201423128 A | 6/2014 |
| TW | 201643448 A | 12/2016 |
| WO | WO 2013/012616 A2 | 1/2013 |
| WO | WO 2016/002003 A1 | 1/2016 |
| WO | WO-2020003458 A1 * 1/2020 ......... G01R 31/2868 |
| WO | WO-2022244235 A1 * 11/2022 | |

OTHER PUBLICATIONS

Japanese-language Written Opinion (PCT/ISA/237) issued in PCT Application No. PCT/JP2018/024678 dated Aug. 28, 2018 (five (5) pages).

Taiwanese-language Office Action issued in Taiwanese Application No. 108120621 dated Aug. 18, 2020 with partial English translation (four (4) pages).

Taiwanese-language Office Action issued in Taiwanese Application No. 108120621 dated Dec. 16, 2019 with partial English translation (six (6) pages).

* cited by examiner

[FIG. 1]
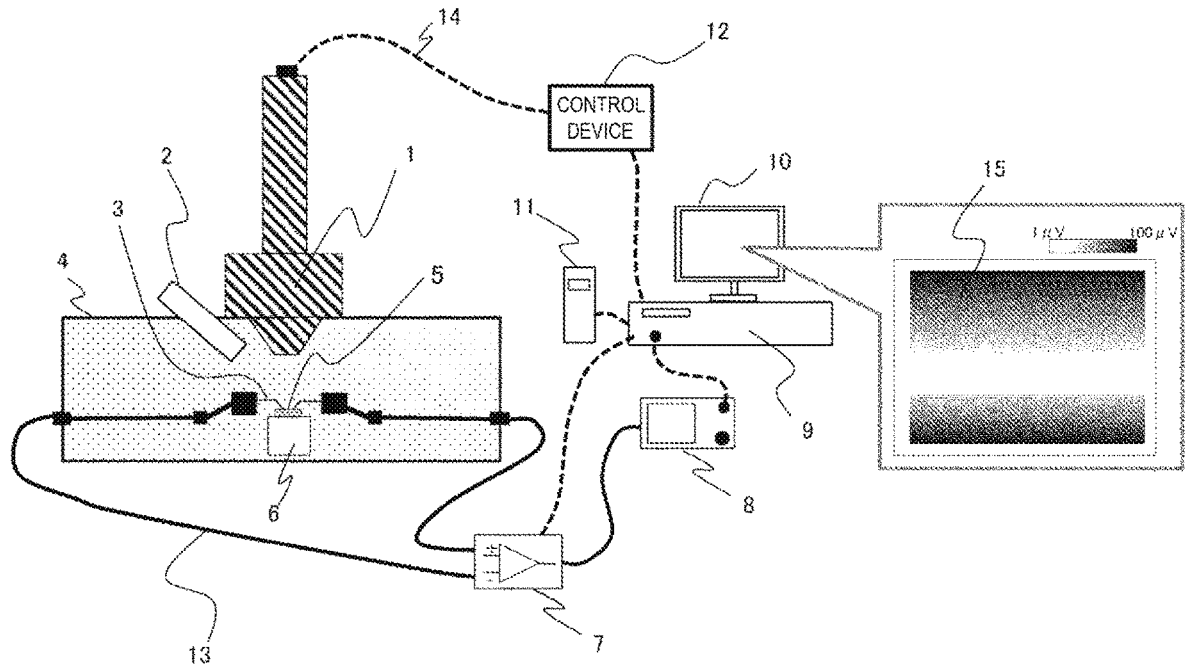
[FIG. 2]
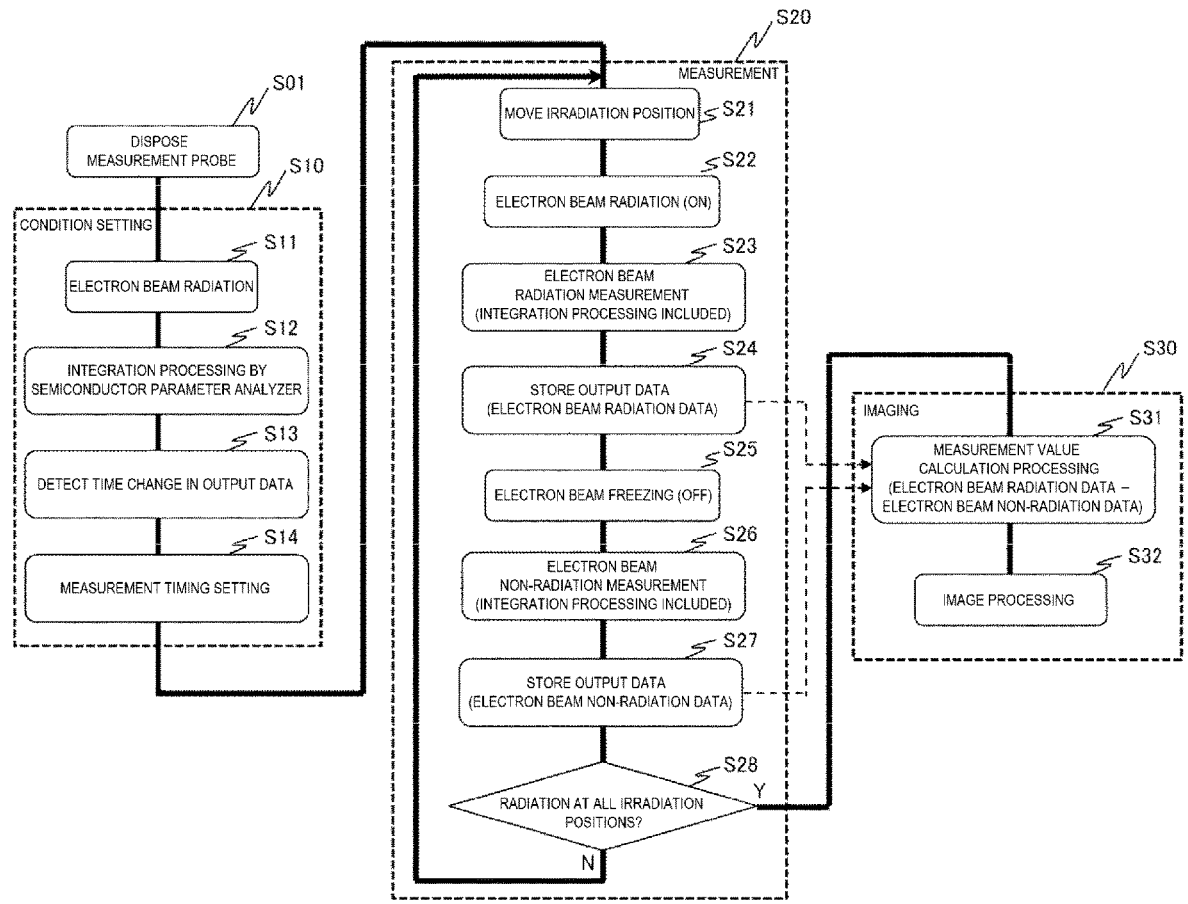

[FIG. 3]
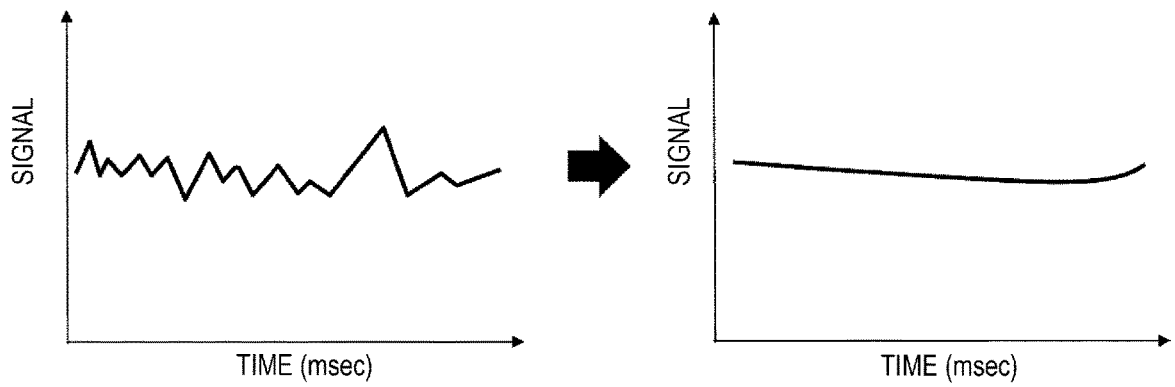
[FIG. 4A]
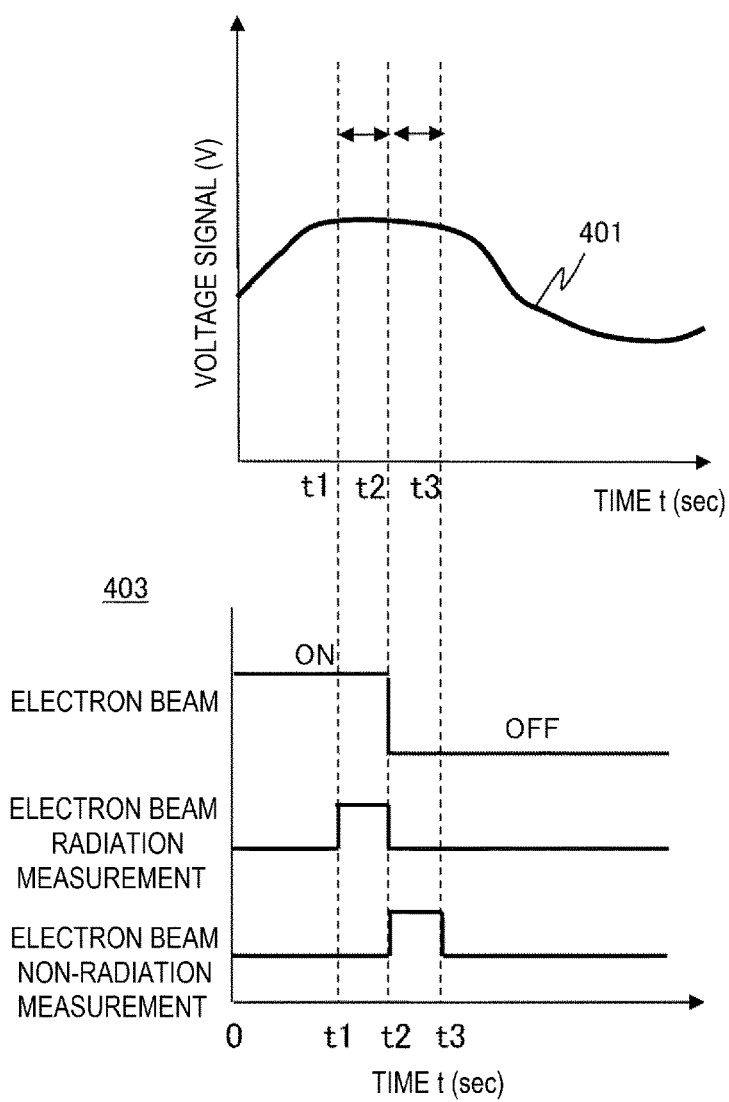

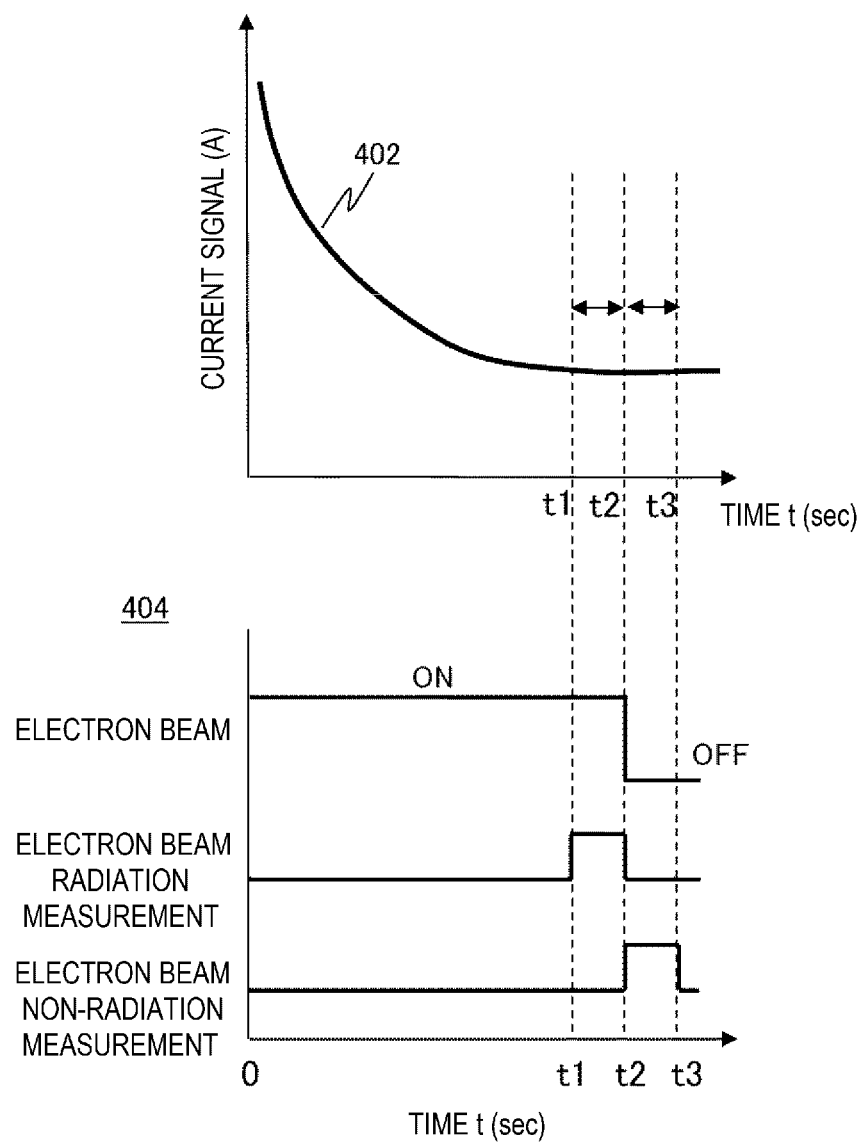
[FIG. 4B]

[FIG. 5]
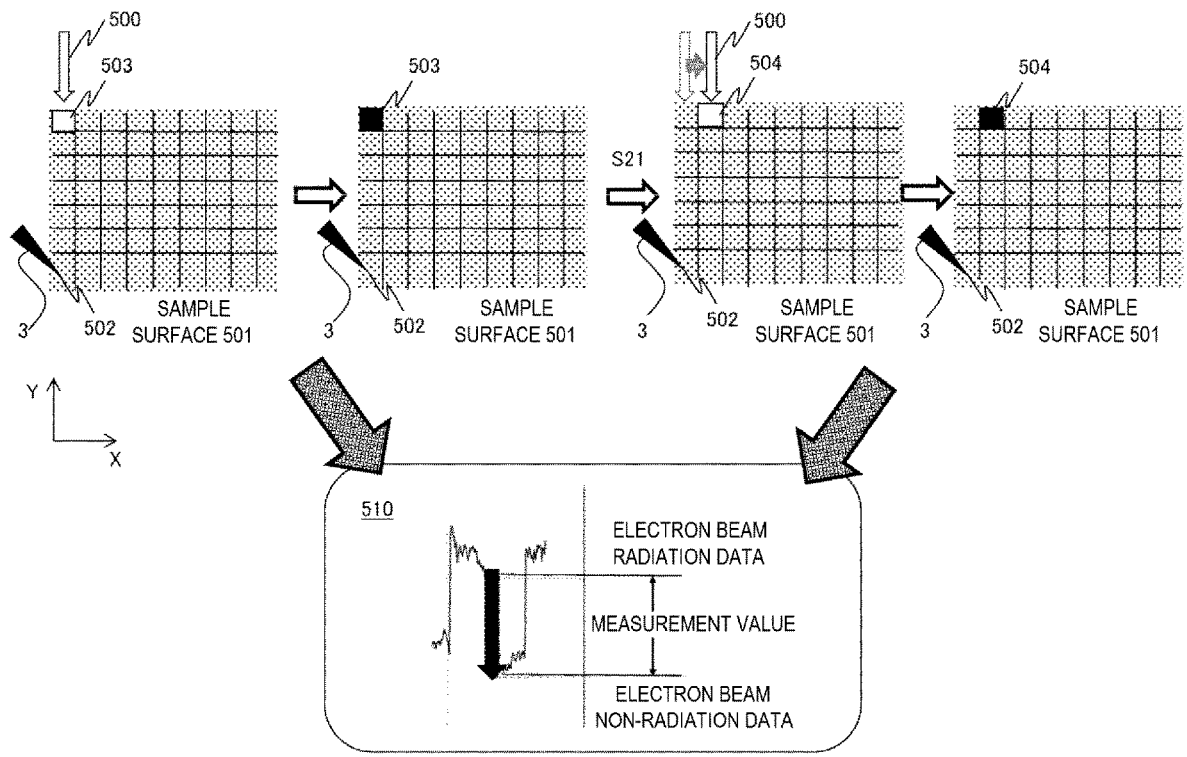
[FIG. 6]
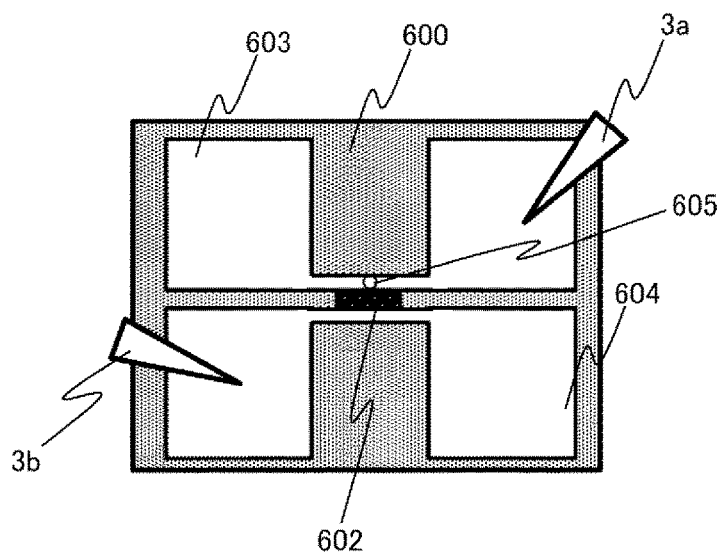

[FIG. 7A]
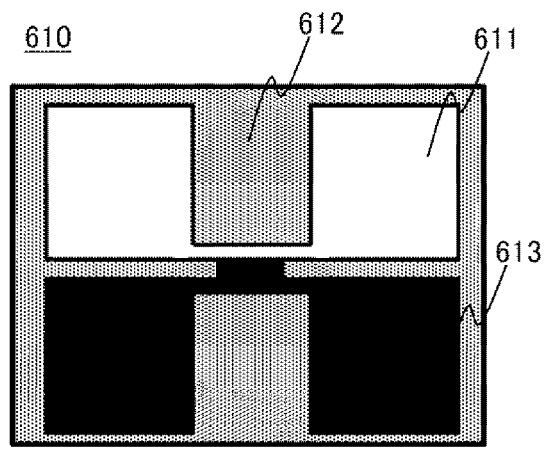
[FIG. 7B]
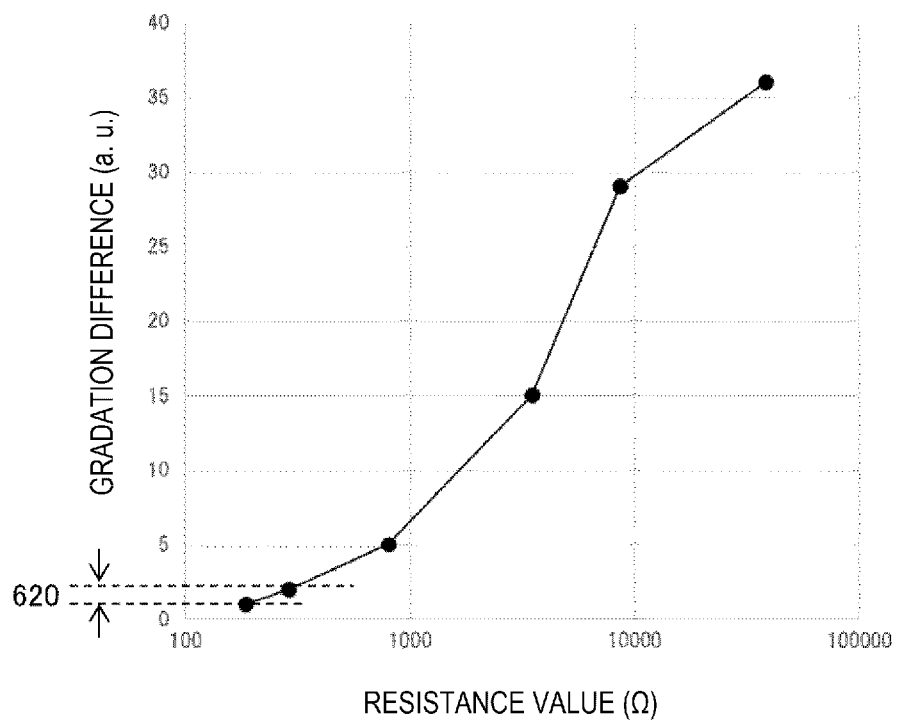

[FIG. 8]
| RESISTANCE VALUE (Ω) | DIFFERENTIAL AMPLIFIER | | VOLTAGE AMPLIFIER |
|---|---|---|---|
| | ELECTRON BEAM RADIATION TO ELECTRODE 603 VALUE OF GAIN OF 1000 TIMES | ELECTRON BEAM RADIATION TO ELECTRODE 604 VALUE OF GAIN OF 1000 TIMES | ELECTRON BEAM RADIATION TO ELECTRODE 603 VALUE OF GAIN OF 100000 TIMES |
| 803 | −0.89(mV) | 1.62(mV) | X |
| 290 | −0.47(mV) | 1.07(mV) | X |
| 186 | −0.48(mV) | 0.22(mV) | X |
[FIG. 9]
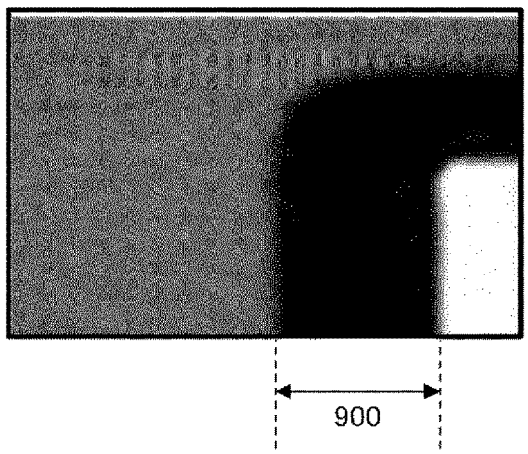
[FIG. 10]
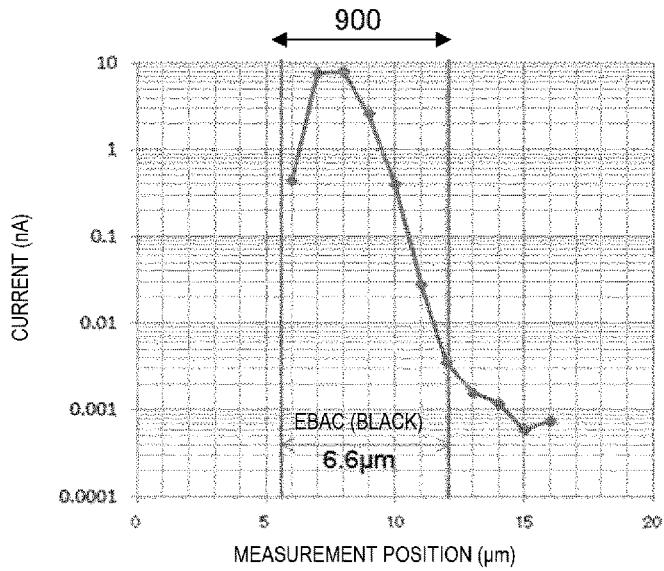

[FIG. 11]
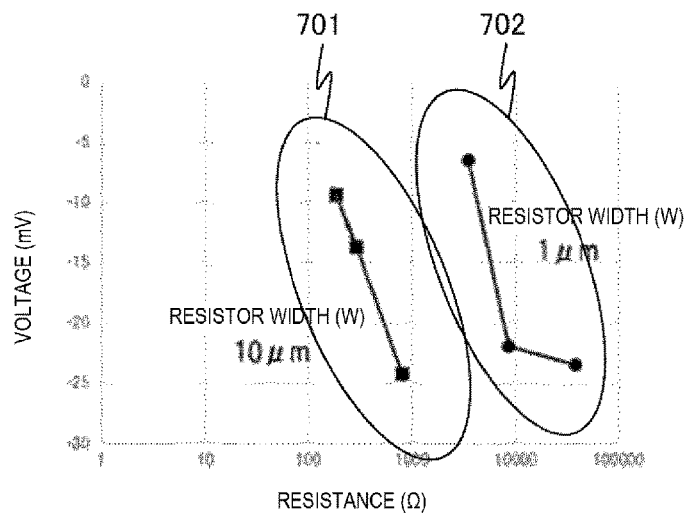
[FIG. 12]
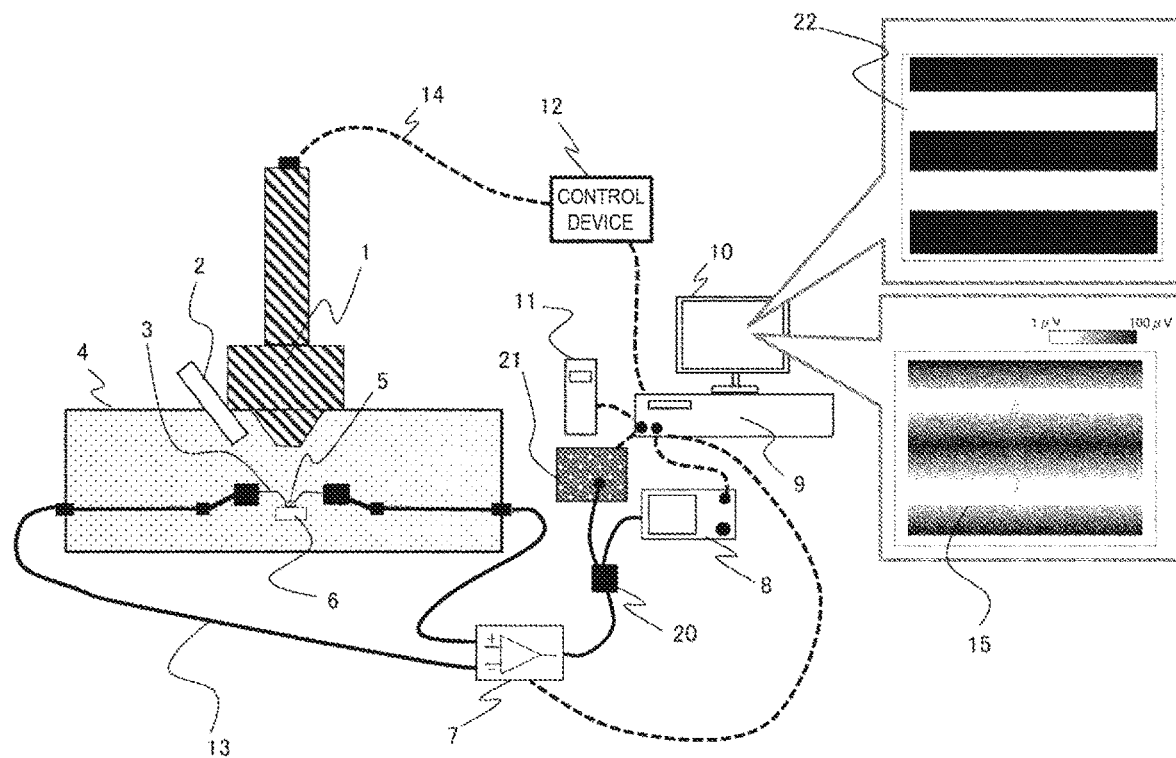

[FIG. 13]
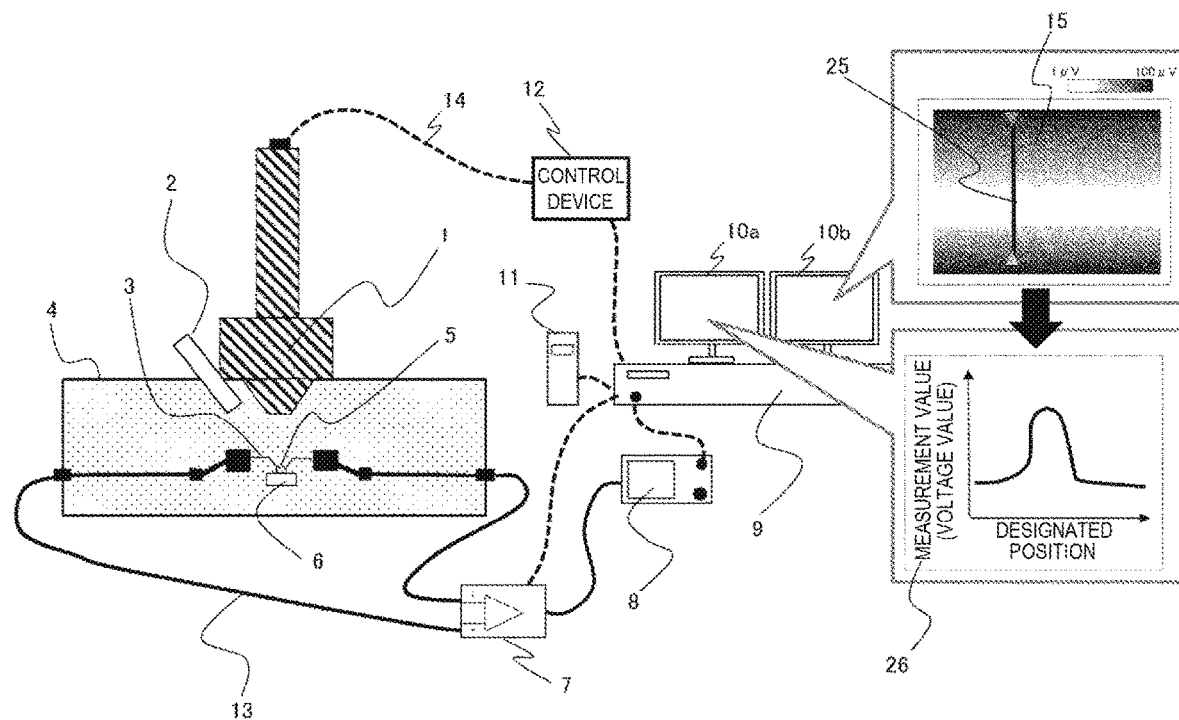
[FIG. 14]
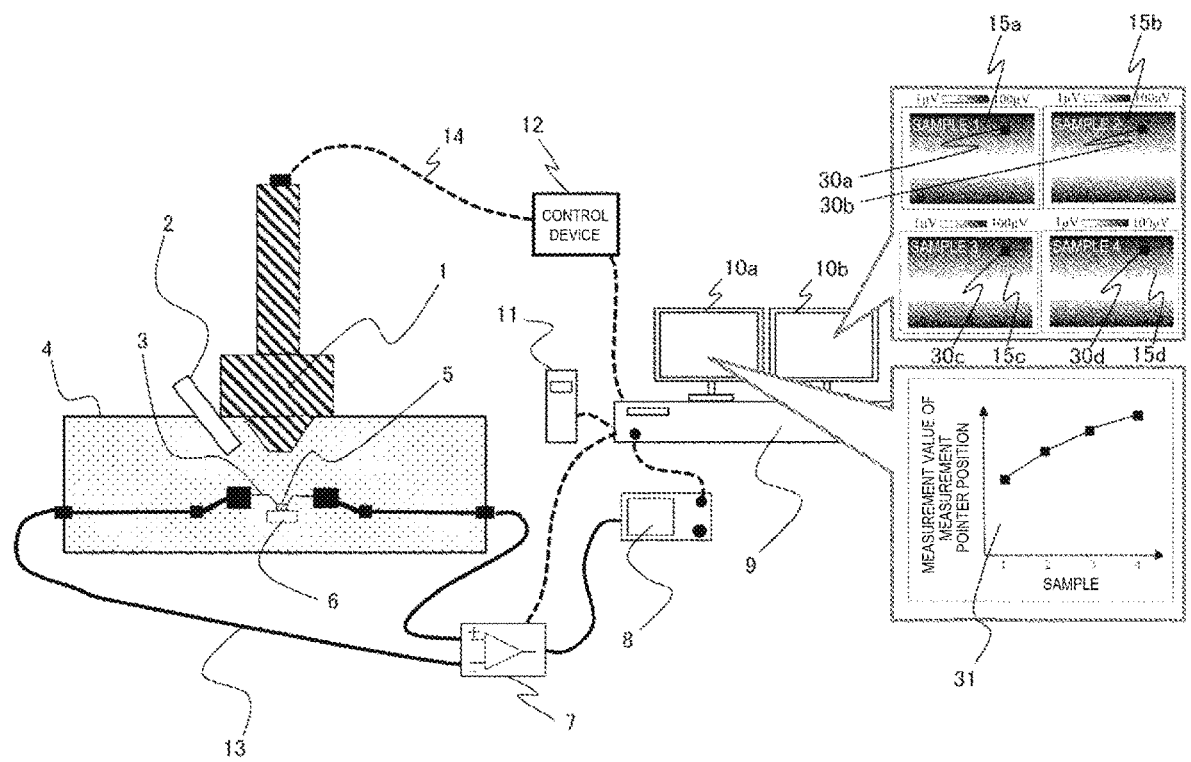

[FIG. 15]
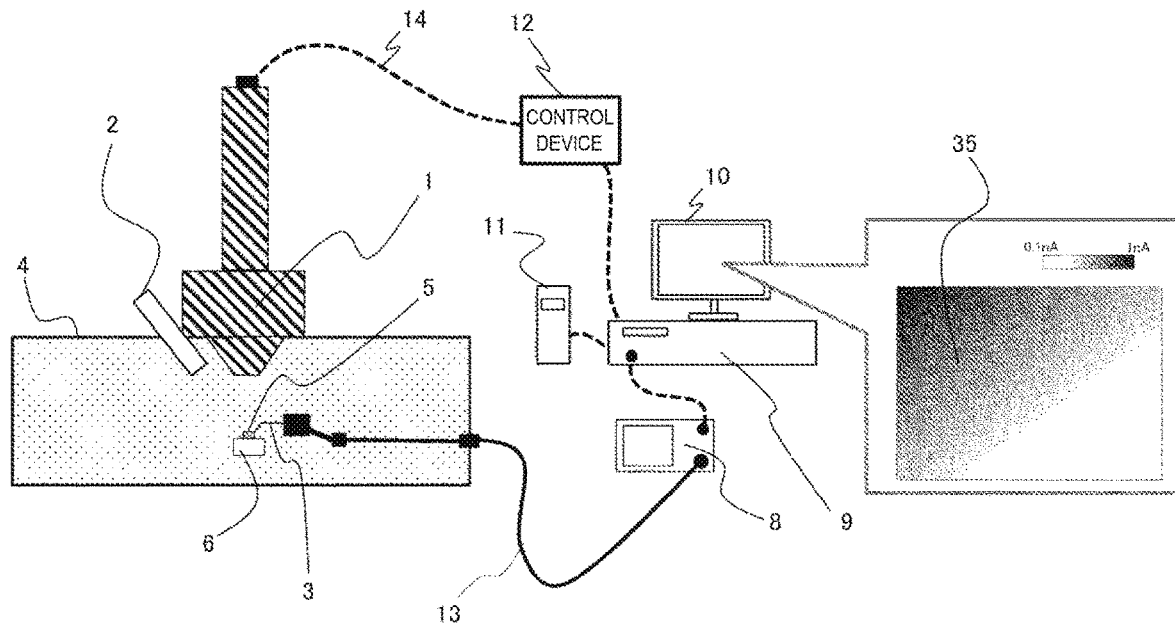
[FIG. 16]
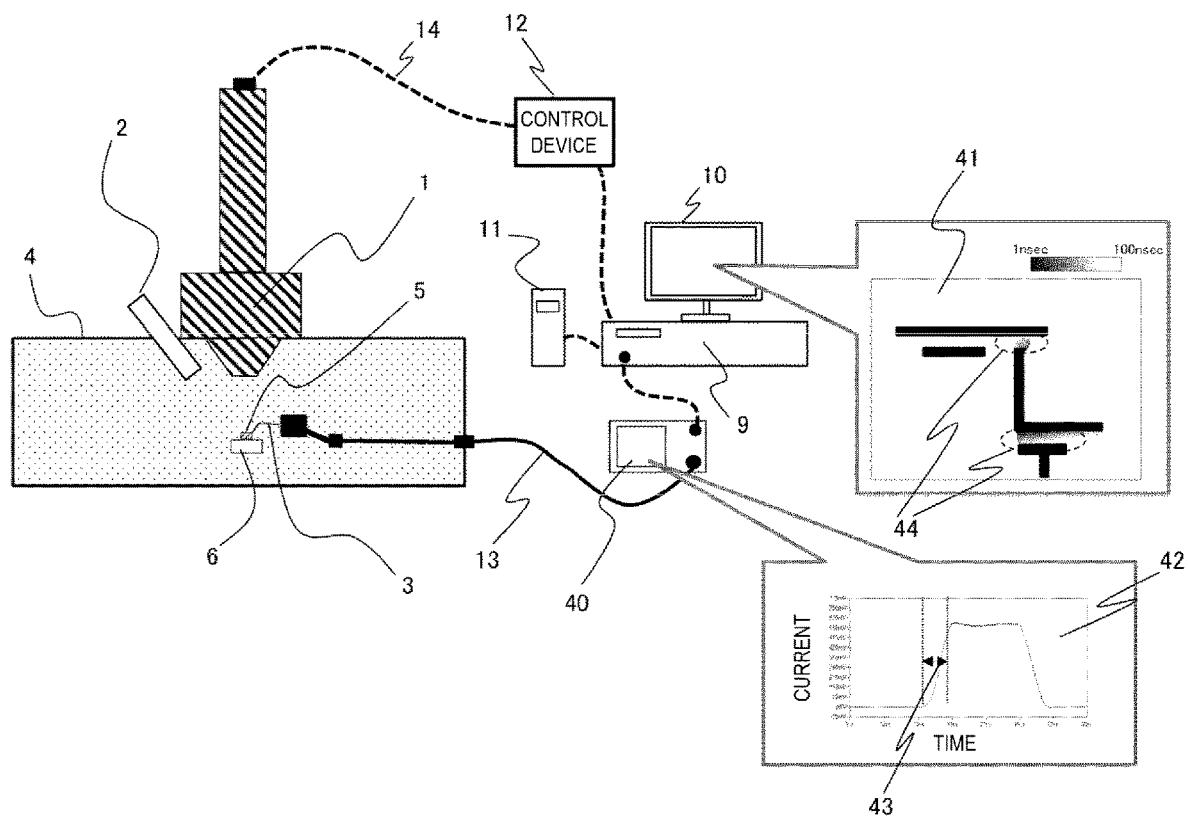

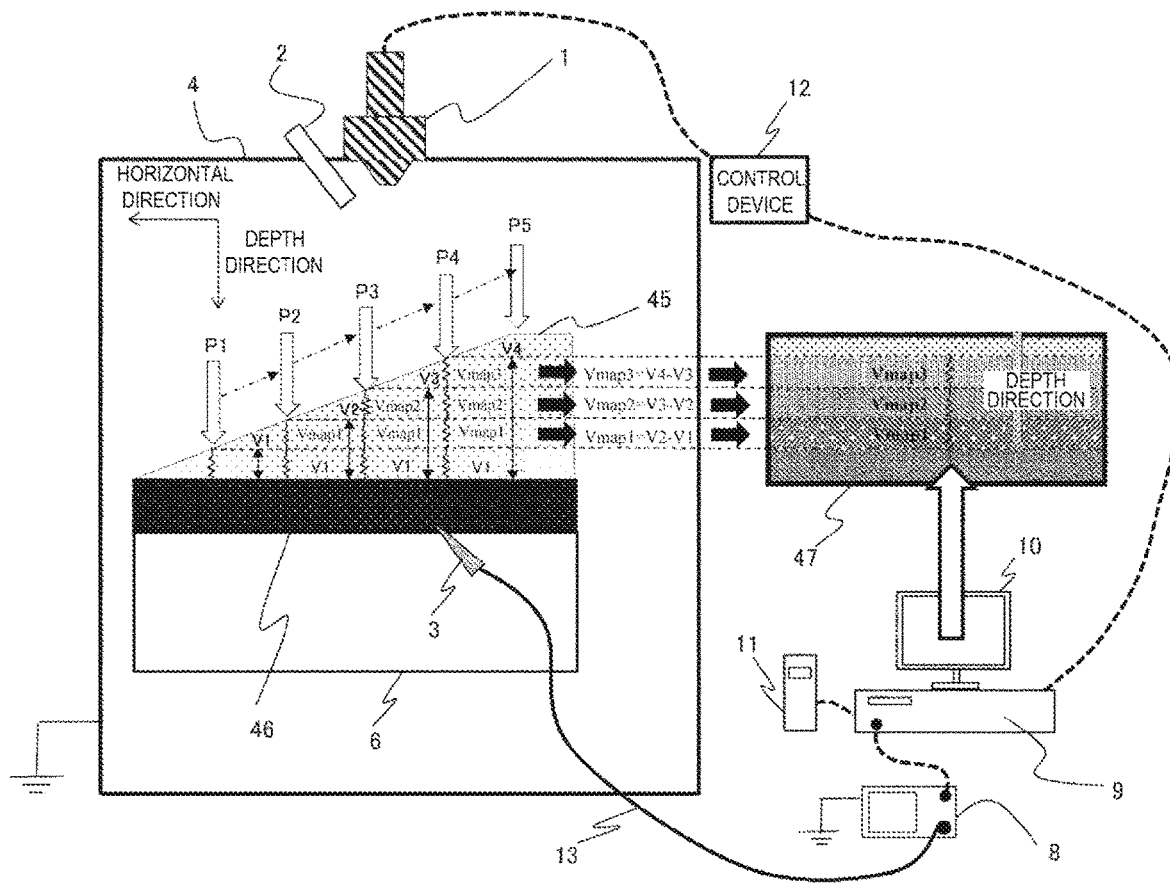
[FIG. 17]
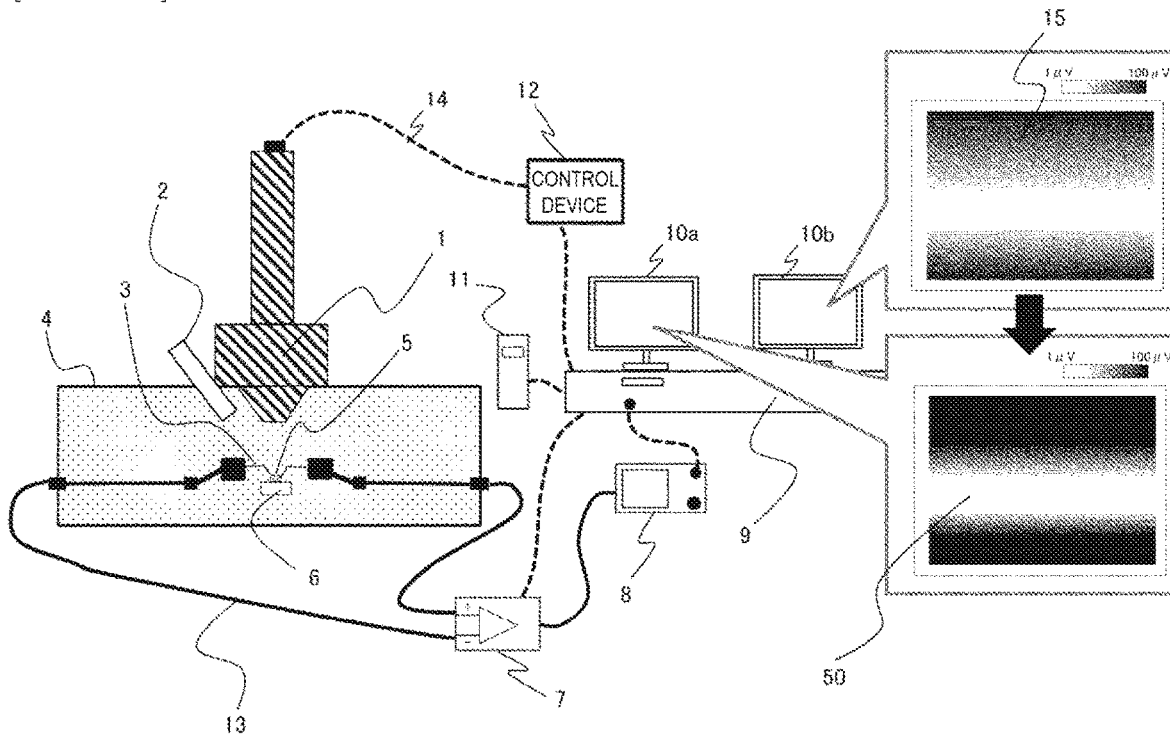
[FIG. 18]

[FIG. 19]
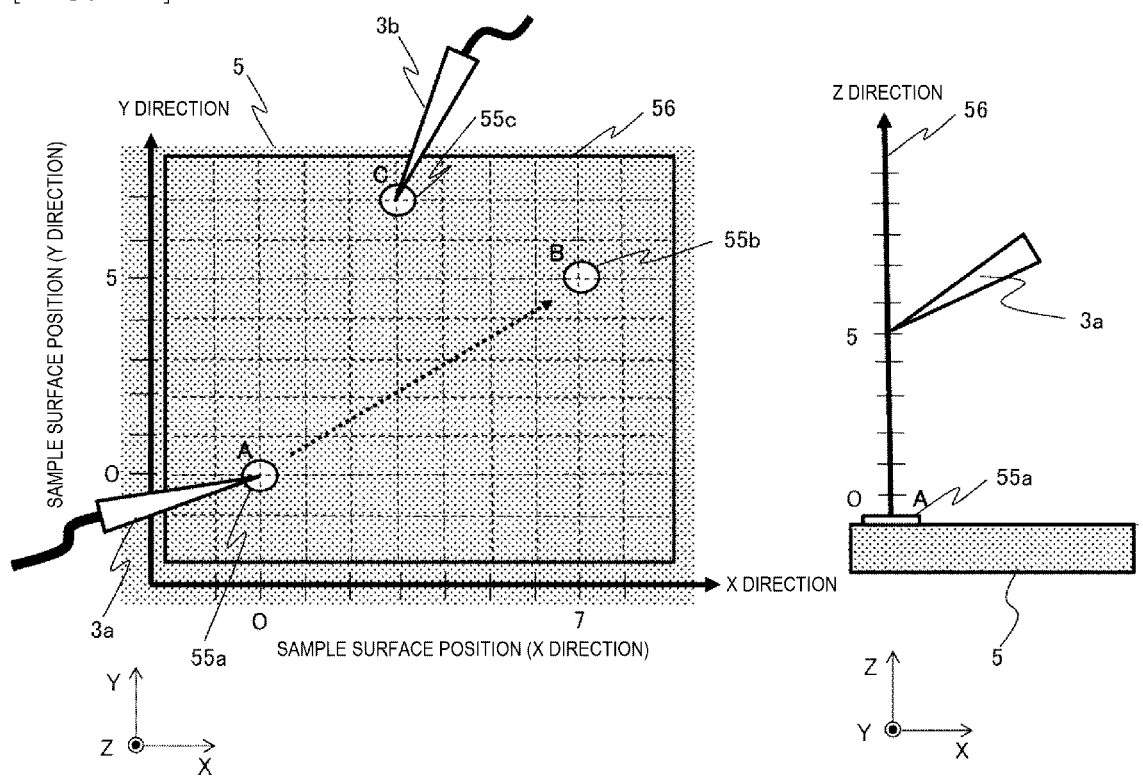
[FIG. 20]
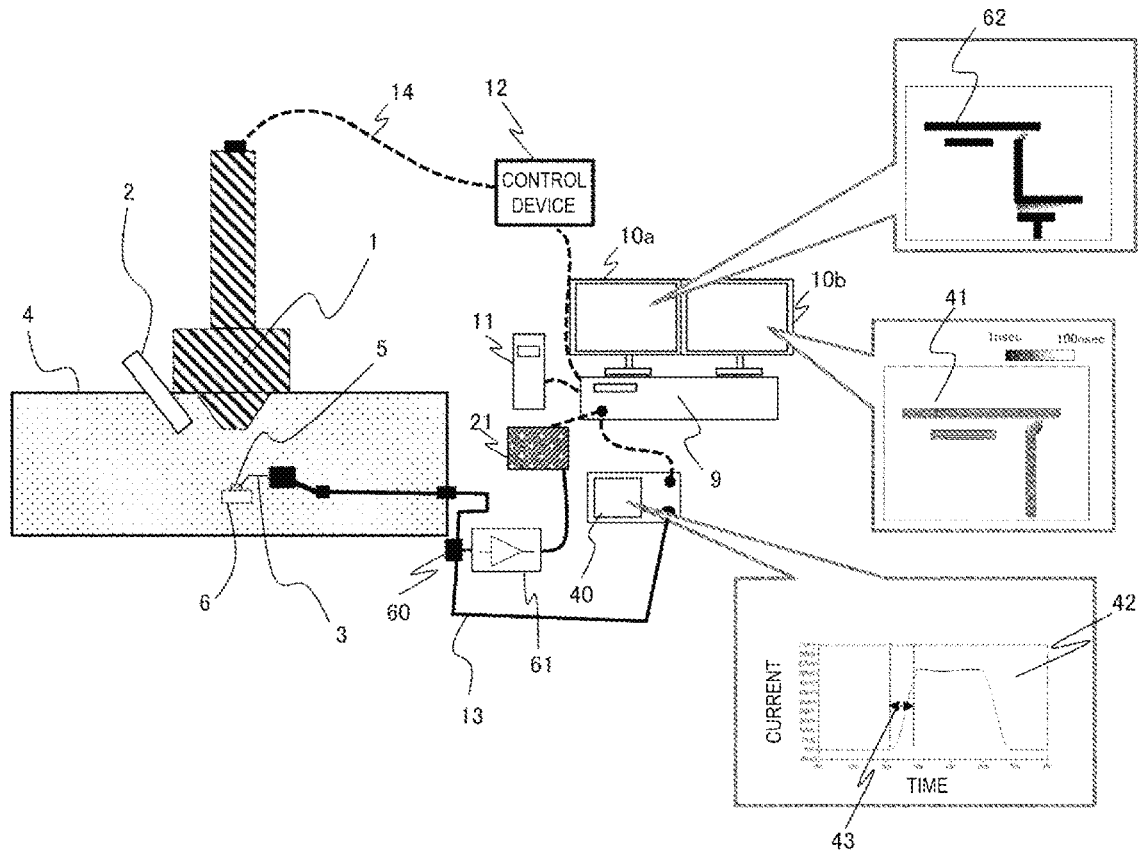

[FIG. 21]
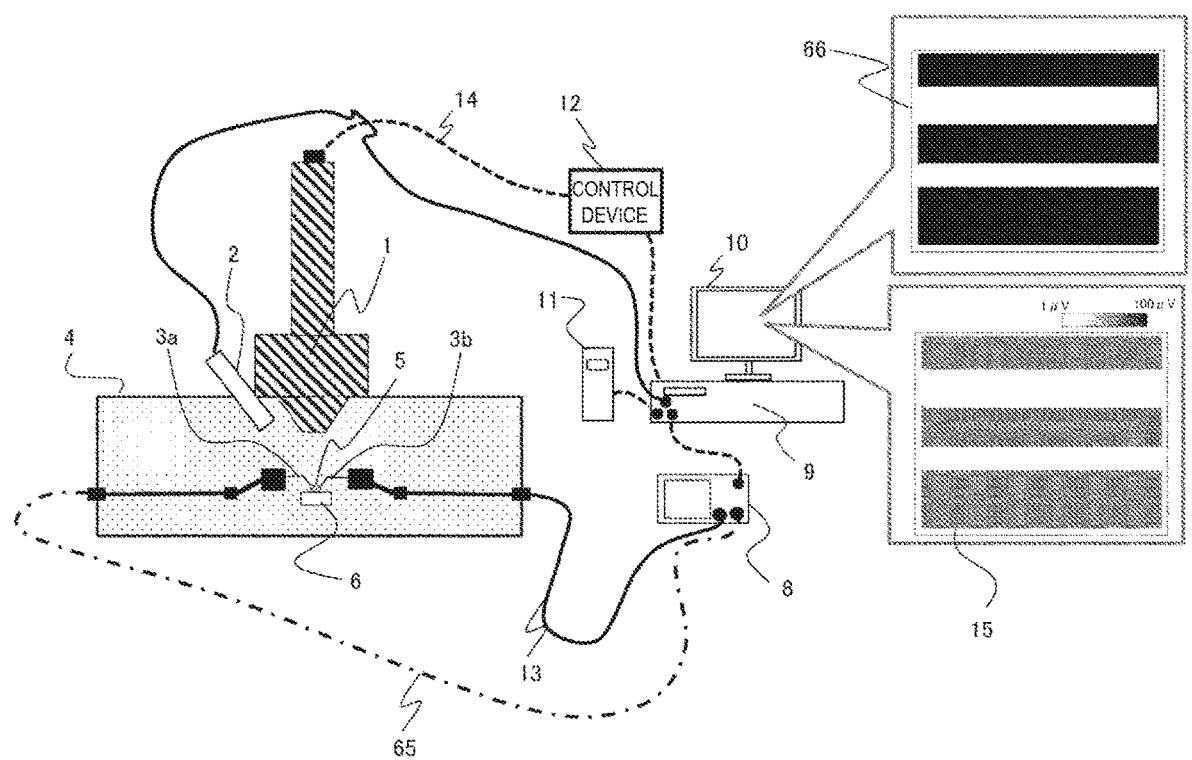

[FIG. 22]
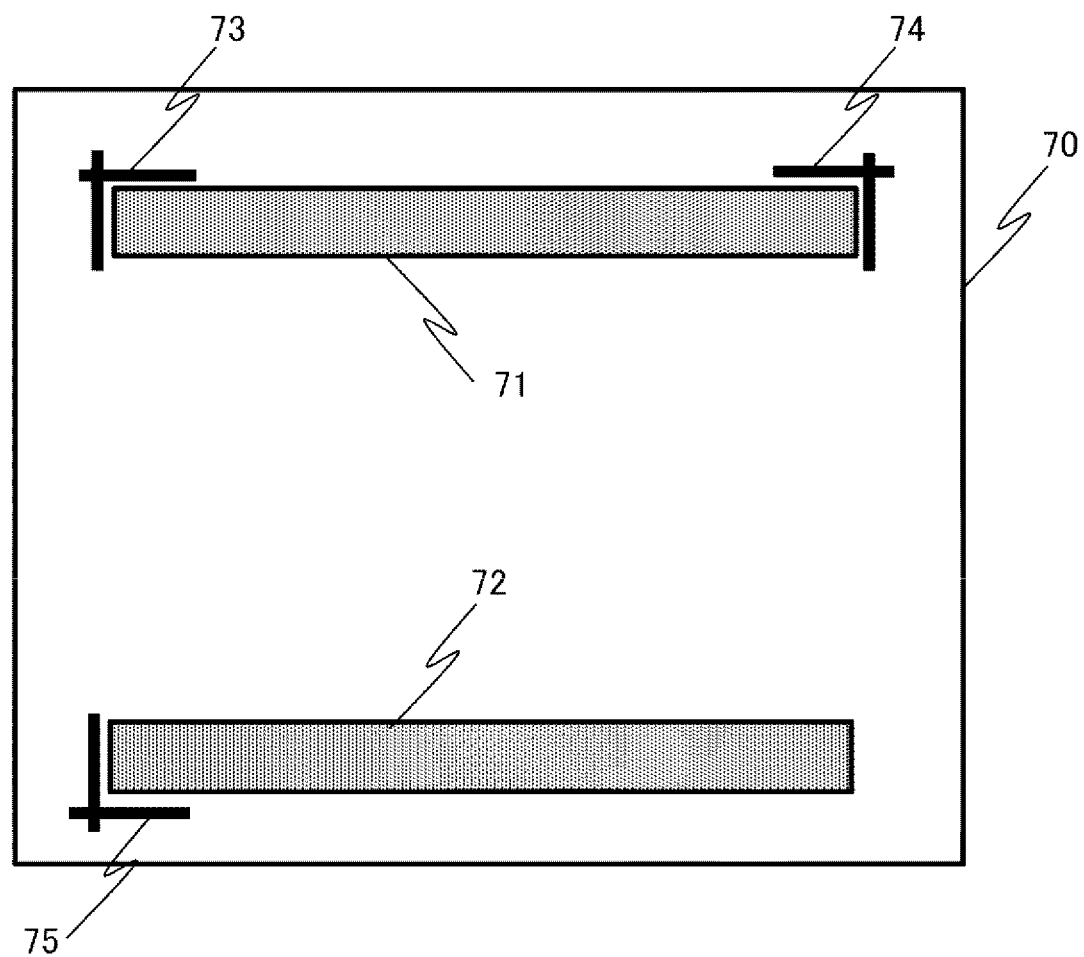

[FIG. 23]
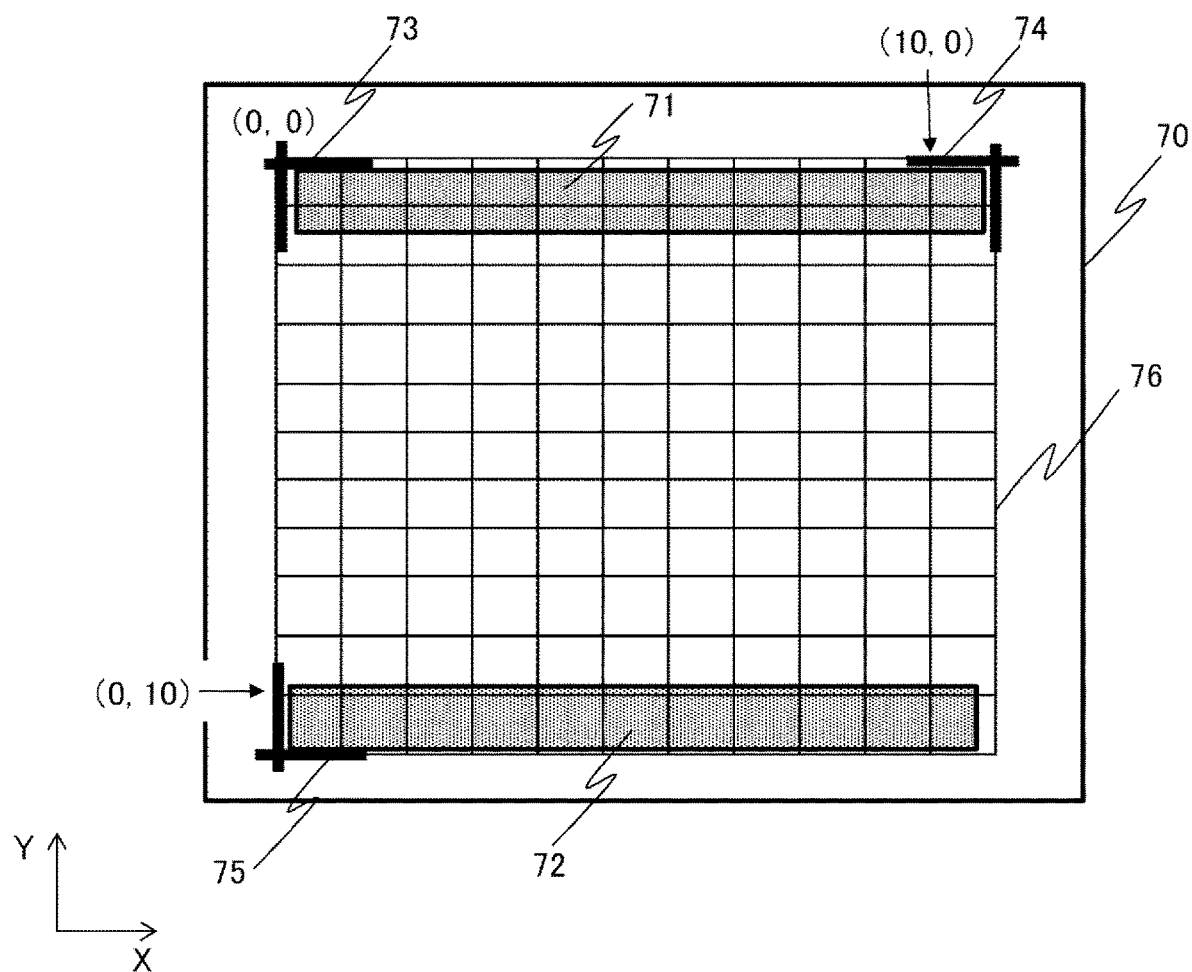

SEMICONDUCTOR INSPECTION DEVICE

TECHNICAL FIELD

The present invention relates to a semiconductor inspection device, and particularly relates to a failure analysis technology for a semiconductor device by a fine-structured device characteristics evaluation system using an electron microscope.

BACKGROUND ART

Due to miniaturization of a semiconductor device, a high-speed and high-performance large-scale integrated circuit (LSI: large-scale integration) has been developed. With the miniaturization of such a semiconductor device, the number of transistors, the number of wirings and the number of contacts increase, resulting in a complicated failure analysis for a defective device and requirement of higher sensitivity for a failure detection technology in a fine-structured device. The fine-structured device refers to a fine structure such as an element integrated in an LSI or a wiring formed in the LSI. Currently, as the failure detection technology, a nanoprobing device that brings a measurement probe into direct contact with a fine region to measure an electrical characteristic has attracted attention. According to this, an electrical characteristic of a nanodevice such as a transistor of a 10 nm generation process can be evaluated by bringing the measurement probe into direct contact with a terminal of the nanodevice, which is a great feature not found in other analysis technologies.

As a device failure analysis method using the nanoprobing device, in addition to measurement of such an electrical characteristic, a failure analysis method called electron beam absorbed current (EBAC) observation disclosed in Patent Literature 1 and the like has been known. In normal SEM observation, a structure of a sample surface is observed by detecting secondary electrons generated when an electron beam (primary electrons) is incident on a sample, and a part of the primary electrons incident at this time does not contribute to generation of the secondary electrons but loses energy and becomes a weak current (an absorption current) flowing in the sample. In the EBAC observation, an absorption current locally flowing between an irradiation position of an electron beam and a measurement probe is detected, and is displayed as an image (an EBAC image) by correlating a change in an obtained signal amount with scanning of the electron beam as a contrast. The EBAC image includes information about the inside of a measurement sample, for example, a shape of a wiring formed in a depth direction of the sample, and can visualize the information. When a disconnection position is present in the wiring, a detection amount of the absorption current varies depending on whether the electron beam irradiation position is on the wiring within the disconnection position or on the wiring beyond the disconnection position as seen from a contact position of the measurement probe. The variation of the detection amount is expressed in different contrasts in the EBAC image. Accordingly, a failure position of a device can be easily known without destroying a defective portion.

PRIOR ART LITERATURE

Citation List

PTL 1: JP-A-2010-135684

SUMMARY OF INVENTION

Technical Problem

Such EBAC observation has the following problems.

(1) A contrast of an EBAC image is blunt for a small resistance defect, and it is difficult to detect a defective position. For example, when a wiring failure is taken as an example, a defective position has large resistance and a sharp contrast can be obtained in a case of an open failure such as disconnection, but the sharp contrast may usually be not obtained in the EBAC image in a case of a wiring short circuit, resulting in difficulty in detection.

(2) In image processing of the EBAC image, a loss of EBAC information may occur due to digital processing of a video signal and a characteristic of an amplifier, such as blackening of the contrast.

First, the first problem will be described. In the EBAC observation, in a case of a small resistor in a sample, a voltage signal generated by the resistor is extremely small with respect to an incident electron dose (hereinafter referred to as a probe current). Therefore, in the case of small resistance materials, a difference in the voltage signal hardly appears, and as a result, it is often difficult to detect an abnormal position based on the contrast of the EBAC image.

In order to increase the contrast of the EBAC image, a larger reaction signal (voltage signal) can be obtained by using an electron gun capable of obtaining a large probe current, such as a Schottky electron gun. However, excessive radiation of the probe current may change quality of a defective portion, which is not preferable from a viewpoint of the failure analysis. Therefore, an increase in sensitivity of an EBAC (EBIC) measurement system, for example, an increase in sensitivity of an EBAC image due to introduction of a lock-in amplifier and an increase in the number of gradations of the video signal have been reported. However, a fine-structured device as a measurement target may include a portion having a capacitive time constant. Although an optimum reference frequency needs to be set for noise removal by a lock-in amplifier, when a measurement position has the capacitive time constant, a measurement signal may be gently attenuated and a noise may not be sufficiently removed. As a semiconductor inspection device, a device capable of performing low-noise and high-sensitivity measurement even if the sample includes the portion having the capacitive time constant is desirable.

Next, the second problem will be described. When a sample in which a semiconductor layer and a metal layer are mixed is under the EBAC observation using a current amplifier, an electron beam induced current (EBIC) reaction that is a characteristic reaction of the semiconductor layer may appear in the EBAC image. An EBIC is a drift current due to electrons and holes generated when the electron beam is incident in vicinity of a junction, and a signal due to the EBIC reaction is an extremely strong current signal. Therefore, when the sample in which the semiconductor layer and the metal layer are mixed is observed, the current signal flowing into an EBAC device has a wide range from about 10 nA due to the EBIC reaction to about 0.001 nA due to a structure portion where few current flows. Even if such a wide range of the signal is divided into 256 gradations to display shades of a video, fineness of the information is lost and the information is likely to be lost. Alternatively, when an excessive current flows, the amplifier used for the EBAC observation may be saturated, and a difference in the contrast cannot be displayed in a saturation region. In such a case, current distribution information to be originally obtained is lost, which, as a result, hinders physical interpretation on a phenomenon occurring in the fine-structured device.

In this way, although the EBAC observation of imaging a change in a detection signal is simple, the information to be originally obtained may be lost depending on a measurement content. The present inventors confirmed that when an electrical characteristic measured using a nanoprobing device is imaged (electrical characteristic mapping), device information that could not be obtained in the related-art EBAC observation can be obtained by increasing sensitivity of signal processing. In addition, an advantage of using the nanoprobing device is that the device failure analysis can be performed from various viewpoints by enabling measurement of various electrical characteristics of the fine-structured device. Therefore, there is provided is a semiconductor inspection device capable of performing an analysis based on a plurality of electrical characteristic map images, or performing an analysis based on the electrical characteristic map images and an analysis by other analysis methods in cooperation with each other.

Solution to Problem

A semiconductor inspection device according to an aspect of the invention includes: a sample stage on which a sample is placed; an electron optical system configured to radiate an electron beam to the sample; a measurement probe configured to come into contact with the sample; a measurement device configured to measure an output from the measurement probe; and an information processing device configured to acquire a measurement value of the output from the measurement probe in response to radiation of the electron beam to the sample. The information processing device sets a timing to start the radiation of the electron beam to the sample and a timing to freeze the radiation of the electron beam, a first measurement period in which the measurement device measures the output from the measurement probe in a state where the electron beam is radiated to the sample, and a second measurement period in which the measurement device measures the output from the measurement probe after the radiation of the electron beam is frozen, and obtains the measurement value of the output from the measurement probe in response to the radiation of the electron beam to the sample from a difference between a first measurement value measured in the first measurement period and a second measurement value measured in the second measurement period.

A semiconductor inspection device according to another aspect of the invention includes: a sample stage on which a sample is placed; an electron optical system configured to radiate an electron beam to the sample; a measurement probe configured to come into contact with the sample; a measurement device configured to measure an output from the measurement probe; a detector configured to detect signal electrons emitted by interaction between the electron beam and the sample; and an information processing device configured to acquire a measurement value of the output from the measurement probe in response to radiation of the electron beam to the sample. The electron optical system scans the sample two-dimensionally according to a first imaging condition, and the information processing device creates an SEM image from a signal detected by the detector and sets virtual coordinates based on the SEM image. The electron optical system scans the sample two-dimensionally according to a second imaging condition, and the information processing device creates an electrical characteristic map image based on the measurement value of the output from the measurement probe measured by the measurement device. The information processing device specifies a position designated by the virtual coordinates on the electrical characteristic map image by performing coordinate conversion on the virtual coordinates based on the first imaging condition and the second imaging condition.

Advantageous Effect

It is possible to provide a semiconductor inspection device capable of electrical characteristic mapping measurement that can detect an abnormality with high sensitivity in a failure analysis of a fine-structured device.

Other technical problems and novel characteristics will be apparent from a description of the description and the accompanying drawings.

BRIEF DESCRIPTION OF DRAWINGS

FIG. 1 is a schematic view of a fine-structured device characteristics evaluation system.

FIG. 2 is a flowchart for creating a voltage map image.

FIG. 3 is a diagram for explaining averaging by integration processing.

FIG. 4A is a diagram showing a time change of a voltage signal and a measurement timing in that case.

FIG. 4B is a diagram showing a time change of a current signal and a measurement timing in that case.

FIG. 5 is a diagram for explaining a method of calculating a measurement value in voltage mapping measurement.

FIG. 6 shows an example of a sample.

FIG. 7A is a schematic view of an EBAC image of the sample shown in FIG. 6.

FIG. 7B is a diagram showing a resistance dependence of a gradation difference in the EBAC image.

FIG. 8 shows an example of measurement by a measurement circuit in FIG. 1.

FIG. 9 shows an example of the EBAC image.

FIG. 10 shows current distribution data corresponding to the EBAC image shown in FIG. 9.

FIG. 11 shows an example of measurement by the measurement circuit in FIG. 1.

FIG. 12 is a schematic view of a fine-structured device characteristics evaluation system according to a first embodiment.

FIG. 13 is a schematic view of a fine-structured device characteristics evaluation system according to a second embodiment.

FIG. 14 is a schematic view of a fine-structured device characteristics evaluation system according to a third embodiment.

FIG. 15 is a schematic view of a fine-structured device characteristics evaluation system according to a fourth embodiment.

FIG. 16 is a schematic view of a fine-structured device characteristics evaluation system according to a fifth embodiment.

FIG. 17 is a schematic view of a fine-structured device characteristics evaluation system according to a sixth embodiment.

FIG. 18 is a schematic view of a fine-structured device characteristics evaluation system according to a seventh embodiment.

FIG. 19 is a diagram showing a probing position setting operation in an eighth embodiment.

FIG. 20 is a schematic view of a fine-structured device characteristics evaluation system according to a ninth embodiment.

FIG. 21 is a schematic view of a fine-structured device characteristics evaluation system according to a tenth embodiment.

FIG. 22 is a diagram for explaining a method of setting virtual two-dimensional coordinates in an eleventh embodiment.

FIG. 23 is a diagram for explaining the method of setting the virtual two-dimensional coordinates in the eleventh embodiment.

DESCRIPTION OF EMBODIMENTS

FIG. 1 is a schematic view of a fine-structured device characteristics evaluation system according to an embodiment of the invention. A scanning electron microscope includes an electron optical system 1, a detector 2 and a vacuum chamber 4 as main components thereof, and is controlled by a control device 12 connected by a communication cable 14. A measurement sample 5 is placed on a sample stage 6 in the vacuum chamber 4, and a measurement probe 3 is in contact with the measurement sample 5. The measurement probe 3 is connected to a drive device (not shown) that moves a sample surface of the measurement sample 5, and is brought into contact with the measurement sample 5 by an operation of the drive device. An output of the measurement probe 3 is connected to a differential amplifier 7 through a measurement cable 13, and an output signal of the differential amplifier 7 is input to a semiconductor parameter analyzer 8. The semiconductor parameter analyzer 8 is a measurement device for parametric test of semiconductor devices such as current-voltage measurement and capacitance measurement. A measurement device corresponding to a measurement target or a measurement content may be used. The semiconductor parameter analyzer 8 is connected to an information processing device 9 through the communication cable 14. Here, a cable that transmits an analog signal is referred to as the measurement cable 13 (a solid line), and a cable that transmits a digital signal is referred to as the communication cable 14 (a broken line). Transmission characteristics, a communication protocol and the like may be different on a basis of connected devices. The information processing device 9 is a device that controls an electron microscope to create an electrical characteristic map image of this embodiment, such as an SEM image from a signal detected by the detector 2 or an EBAC image from a signal detected by the measurement probe 3, and to display the image. For example, a personal computer or the like can be applied. The detector 2 detects signal electrons emitted by interaction between an electron beam from the electron optical system 1 and the measurement sample 5. A plurality of detectors may be provided according to differences in energy and the like of the signal electrons to be detected. An amplification factor of the differential amplifier 7 is controlled by the information processing device 9. Accordingly, when the output signal of the differential amplifier 7 is excessively large, the amplification factor can be reduced.

A measurement circuit in FIG. 1 has a configuration suitable for measuring a voltage as an electrical characteristic and creating a voltage map image as an electrical characteristic map image. Since the voltage map image in this embodiment can obtain high detection sensitivity for a small resistance defect as will be described later, the voltage map image is suitable for defect detection and failure analysis of a small resistance metal wiring or the like.

The differential amplifier 7 amplifies an extremely weak signal from a sample generated in the measurement probe 3 by a probe current and outputs a voltage signal, but the output signal has various noises. In order to obtain an accurate voltage map image, such noises need to be removed as much as possible. FIG. 2 shows a flow of creating the voltage map image by the fine-structured device characteristics evaluation system in FIG. 1. The flow mainly includes condition setting for measurement (S10), the measurement (S20), and imaging of a measurement value (S30). First, the measurement sample 5 is placed on the device, and the measurement probe 3 is brought into contact with the sample surface (S01). Subsequently, the condition setting is performed. A noise to be removed is large, and can be divided into a high frequency random noise and a low frequency noise. First, an electron beam is radiated to any position on the sample surface (S11). A signal of the measurement probe obtained as a result is amplified by the differential amplifier 7, and the high frequency random noise is removed from the voltage signal using integration processing of the semiconductor parameter analyzer 8 (S12). In the integration processing, signals mixed with the random noise are added for a predetermined period and averaged as shown in FIG. 3. Accordingly, an influence of the random noise can be removed.

Next, a time change in voltage signal data from which the high frequency random noise has been removed is detected (S13). The output signal changes with time due to an influence of the low frequency noise. FIG. 4A shows a pattern observed during voltage measurement, which is the low frequency noise peculiar to the fine-structured device characteristics evaluation system. The output signal (the voltage signal) drifts due to an influence of vibration of an exhaust pump that exhausts the vacuum chamber 4, an electrical noise of the evaluation system, or the like. It is not only the voltage signal that is influenced by such a low frequency noise. When the current map image is created as the electrical characteristic map image, a current signal is detected (a device configuration and the like in this case will be described later), and the low frequency noise is also present in the current signal. FIG. 4B shows a pattern observed during current measurement, and, when the measurement sample 5 is a large resistance sample (a semiconductor or the like), shows a change in the output signal (the current signal) having a time constant due to a capacitance of the measurement sample 5.

Therefore, the information processing device 9 obtains a time period having the smallest time change from the time change of the voltage signal data (or current signal data) from which the random noise of the measurement sample 5 is removed by, for example, differential analysis. Specifically, in signal waveforms 401, 402 shown in FIGS. 4A and 4B, a time period t1 to t3 can be detected as the time period having a small time change. Therefore, a measurement timing is set such that the measurement is performed during the time period t1 to t3 (S14). A measurement timing chart in a case of the signal waveform 401 is 403, and a measurement timing chart in a case of the signal waveform 402 is 404. In any case, at time t2 during the time period t1 to t3, radiation of the electron beam to the measurement sample 5 is frozen, and the output signal is measured in a time period t1 to t2 immediately before t2 and a time period t2 to t3 immediately after t2. Each of the time period t1 to t2 and the time period t2 to t3 has a time for performing the integration processing for removing the high frequency random noise. In a case of measuring the voltage signal, since the low frequency noise is not caused by the radiation of the electron beam, periodicity of the low frequency noise is extracted, and a reference time (t=0) is determined by monitoring a low frequency noise waveform. On the other hand, in a case of measuring the current signal, since the low frequency noise is caused by the radiation of the electron beam, a reference time (t=0) coincides with a radiation start time of the electron beam. As described above, the condition setting for preventing the influence of the noise and performing the measurement is completed.

The measurement of the measurement sample 5 is started (S20) according to the measurement timing set in the condition setting (S10). FIG. 5 shows a state of the measurement. The measurement probe 3 is in contact with one point 502 on a sample surface 501, and the sample surface 501 is scanned with an electron beam 500 in an X direction and a Y direction. A square virtually shown on the sample surface 501 represents an irradiation position of the electron beam 500, and corresponds to one pixel of the voltage map image. First, the irradiation position is moved to, for example, a position 503 (S21), and radiation of the electron beam 500 is started (S22). The measurement of the output signal is performed at a measurement timing t1 to t2 set in the condition setting (S23). In the measurement, the integration processing by the semiconductor parameter analyzer 8 is performed. The information processing device 9 stores output data that has undergone the integration processing (herein referred to as "electron beam radiation data") in a database 11 (S24). Subsequently, at the time t2, the radiation of the electron beam 500 to the position 503 is frozen (S25), and the output signal is measured at the measurement timing t2 to t3 set in the condition setting (S26). Also in the measurement, the integration processing by the semiconductor parameter analyzer 8 is performed. The information processing device 9 stores output data that has undergone the integration processing (herein referred to as "electron beam non-radiation data") in the database 11 (S27). The information processing device 9 determines whether the radiation and measurement have been completed at all irradiation positions (S28), and if not completed, the processing moves to a next irradiation position. For example, the irradiation position is moved to a position 504 adjacent to the position 503 in the X direction (S21), and the radiation of the electron beam 500 is started (S22). When the radiation of the electron beam to all irradiation positions and the measurement at all irradiation positions are completed, the measurement ends, and measurement results at all irradiation positions are stored in the database 11.

A flow of the measurement (S20) in FIG. 2 is a large flow, and is not limited thereto. For example, the electron beam radiation data and the electron beam non-radiation data do not need to be stored in the database 11 for each radiation, and may be stored in a more integrated unit, for example, may be temporarily stored in the information processing device 9 during the measurement and stored in the database 11 after the measurement is completed. Since the information processing device 9 controls a gain of the differential amplifier 7 such that the measurement of the semiconductor parameter analyzer 8 can be appropriately performed, it is desirable to store a value obtained by correcting the gain of the differential amplifier 7 as the output data instead of storing an output value of the semiconductor parameter analyzer 8 directly. The output data and the gain of the differential amplifier 7 may be stored as a set.

Imaging (S30) is performed using the electron beam radiation data and the electron beam non-radiation data obtained in the measurement (S20). As indicated by 510 in FIG. 5, a difference between the electron beam radiation data and the electron beam non-radiation data is calculated as the measurement value (S31). This calculation removes the influence of low frequency noise from the measurement value. A pixel value of each pixel is determined based on a value of the measurement value, and is displayed as a numerical mapping image (=voltage map image) (S32). At this time, in the system according to this embodiment, since the measurement value (a numerical data) measured by radiating the electron beam to a position corresponding to each pixel is held, a measurer can set a range of numerical values to be displayed, that is, switch a measurement range, and create and display the numerical mapping image according to an analysis viewpoint. By assigning pixel values such that colors and shades can be identified in the range of the set numerical values, a loss of information such as blackening can be avoided and a wide-range analysis can be performed.

Hereinafter, a solution to the first problem will be described based on an analysis example using the fine-structured device characteristics evaluation system in FIG. 1. FIG. 6 shows an example of a sample used as an analysis target. A resistor 602 is formed on an insulator layer 600, and electrodes 603, 604 are provided to sandwich the resistor 602. A measurement probe 3a connected to a + terminal of the differential amplifier 7 is brought into contact with the electrode 603, and a measurement probe 3b connected to a − terminal of the differential amplifier 7 is brought into contact with the electrode 604. Here, the insulator layer 600 is formed of a $SiO_2$ layer, the resistor 602 is formed of Si, and the electrodes 603, 604 are formed of Al. As a resistance value of the resistor 602, a plurality of samples having different resistance values are prepared.

When the sample shown in FIG. 6 is under EBAC observation and the resistance value of the resistor 602 is large (for example, on an order of tens of kΩ), a sharp contrast is displayed on an EBAC image 610 with the resistor 602 as a boundary as shown in FIG. 7A. Accordingly, it can be determined that there is a resistor at a change point of the contrast. This corresponds to the defect detection of an open failure in a failure analysis of the semiconductor device. However, as the resistance value of the resistor 602 decreases, a difference between a sharp contrast portion 611 and a blunt contrast portion 613 decreases. FIG. 7B is a diagram showing a resistance dependence of a gradation difference in the EBAC image 610. A horizontal axis represents the resistance value of the resistor 602 and a vertical axis represents the gradation difference between the blunt contrast portion 613 and a background portion 612 corresponding to the insulator layer 600. An electron dose (a probe current) radiated to the sample is 1 nA as an EBAC observation condition. In this way, when the resistance value of the resistor 602 decreases, the gradation difference from the background portion 612 becomes small, and when the resistance value of the resistor 602 is on the order of hundreds of Ω, the gradation difference 620 is extremely small even if the resistance value of the resistor 602 changes. Therefore, a contrast difference cannot be visually recognized from the EBAC image. This is why it is difficult to detect the small resistance defect such as a wiring short in the EBAC image. A voltage generated when an electron beam having an electron dose of 1 nA is radiated to a resistor of 100Ω is 0.1 µV. Therefore, in order to detect the defect such as the wiring short, a minute voltage signal difference of about 0.1 µV needs to be distinguished.

FIG. 8 shows measurement results of the same sample using a measurement circuit in the fine-structured device characteristics evaluation system in FIG. 1. FIG. 8 shows a voltage signal amount measured by the semiconductor parameter analyzer 8 in the measurement circuit in FIG. 1 when the electron beam is radiated to a region of the electrode 603 or the electrode 604 in the sample shown in FIG. 6. The resistance value of the resistor 602 was measured for three types of samples of 803 Ω, 290Ω and 186Ω. In this measurement, a position of the measurement probe 3 is as shown in FIG. 6, and a radiation current of the electron beam is also set to 1 nA, which is the same as that of the EBAC observation described above. The gain of the differential amplifier 7 is 1000 times, and a measurement method is as described with reference to FIGS. 2 and 5. The voltage map image according to this embodiment can be formed by shading a magnitude of the voltage signal amount and setting a pixel value of the irradiation position of the electron beam. A comparative example also shows a result of using a voltage amplifier (a gain of 100000 times) instead of the differential amplifier 7.

Accordingly, it can be confirmed that an absolute value of a voltage value output from the differential amplifier 7 tends to decrease as the resistance value of the resistor 602 decreases. The measurement circuit according to this embodiment can detect a difference in resistance of this degree, which means that an abnormality due to a small resistance failure can be detected. In the voltage amplifier shown as the comparative example, data is buried in the noise, and values could not be acquired.

At present, a minimum possible measurement voltage of a general measurement device used for parametric test of the semiconductor device is about 0.5 μV. In contrast, the measurement circuit according to this embodiment enables a minute voltage signal difference of about 0.1 μV. Therefore, the noise is thoroughly removed in the measurement circuit according to this embodiment. Since the differential amplifier 7 amplifies a difference between two measurement cables, the noise that is similarly applied to both measurement cables can be removed. Next, as described above, the integration processing is performed by the measurement device, thereby removing the random noise that cannot be removed by the differential amplifier 7. Further, the measurement is performed at the measurement timing set by the condition setting shown in FIG. 2, and a difference between the measurement value when the electron beam is radiated and the measurement value when the electron beam is not radiated is used as the measurement value. A type of the noise that can be dealt with is determined for each noise removal method, and high sensitivity detection is implemented by using a wide range of methods.

In addition, when the signal amount is large and the influence of the noise is small, the information processing device 9 adjusts the amplification factor of the differential amplifier 7 or an integration amount of the measurement device. In this way, the information processing device 9 not only acquires and processes measurement data, but also plays a role of providing an optimum noise removal step according to the type of the noise included in the measurement data.

Next, a solution to the second problem will be described. FIG. 9 shows an example of the EBAC image obtained by observing a semiconductor layer. A blackened portion 900 is a reaction from the semiconductor layer. In contrast, FIG. 10 shows a result of the measurement using the measurement circuit in the fine-structured device characteristics evaluation system in FIG. 1. This is a graph obtained by measuring a current value of a part of the blackened portion 900. Accordingly, although the EBAC image has been blackened, it can be recognized that a current change is present in the region. In this way, detailed information can be obtained even in a region where information cannot be obtained in the EBAC image, and a physical interpretation in such a region can be performed.

The contrast of the EBAC image is based on an absorbed current. Here, since the absorbed current amount changes due to a nanoscale internal structure of the measurement sample and a complicated behavior of the incident electrons, there is a limit to information that can be obtained only by visually observing the contrast. In contrast, since the voltage value can be accurately measured by the fine-structured device characteristics evaluation system in FIG. 1, this embodiment has a potential to obtain information that cannot be obtained by a related-art EBAC image.

The example of the sample shown in FIG. 6 will be described. As the resistance value of the resistor 602, six samples having different resistance values were prepared for analysis. As shown in FIG. 6, the samples are in contact with different materials such as the electrode 603 (Al) and the resistor 602 (Si). Therefore, in the EBAC image, a contrast across a boundary between the electrode 603 and the resistor 602 increases due to a Seebeck reaction, and a white and black image is displayed at the boundary. However, as described above, as the resistance value of the resistor 602 decreases, the contrast of the EBAC image decreases, and the contrast due to the Seebeck reaction decreases. Therefore, when the resistance value of the resistor 602 reaches hundreds of Ω, only information that allows presence of the contrast due to the Seebeck effect to be visually recognized in the EBAC image can be obtained. In contrast, FIG. 11 shows the voltage value measured by radiating the electron beam to a position 605 shown in FIG. 6 for each sample. A horizontal axis represents the resistance value of the resistor 602, and a vertical axis represents the voltage value (a value after being amplified by the differential amplifier). As shown in FIG. 11, it was found that the six samples are divided into two groups by drawing a graph focusing on a numerical value of the voltage value. The two groups have different sizes of the resistor 602, a group 701 has a resistor width of 10 μm, and a group 702 has a resistor width of 1 μm. In this way, knowledge about the internal structure and phenomenon of the fine-structured device can be deepened by obtaining accurate numerical data.

First Embodiment

FIG. 12 shows a fine-structured device characteristics evaluation system according to a first embodiment. In this embodiment, a cooperative analysis of an EBAC analysis based on an EBAC image and an electrical characteristic map analysis based on an electrical characteristic map image can be performed. Specifically, the EBAC analysis that enables high-speed observation of a wide range of a sample surface is used to confirm approximate abnormal positions, and after narrowing down inspection positions, details are analyzed by the electrical characteristic map analysis that needs time for measurement processing.

The same components as those of the fine-structured device characteristics evaluation system in FIG. 1 are denoted by the same reference numerals, and repetitive description will be omitted. The same applies to the following embodiments. In this embodiment, the differential amplifier 7 is connected to the semiconductor parameter analyzer 8 and the EBAC control device 21 through a switch 20. Electrical characteristic map observation and EBAC observation can be switched by this switching. The EBAC control device 21 outputs an output of the differential amplifier 7 as a signal indicating an absorbed current amount at an irradiation position of an electron beam, and images an EBAC image 22 by the information processing device 9.

As described above, a measurement circuit in the fine-structured device characteristics evaluation system in FIG. 12 is adapted to an analysis of a small resistance failure that is difficult to detect in the EBAC image, and can be used for defect detection, analysis and the like in a wiring structure of an LSI device. First, a measurement contact of the LSI device is polished until being exposed on a surface. The LSI device thus polished is used as the measurement sample 5, and the measurement probe 3 is brought into contact with the contact exposed on the surface. First, the output of the differential amplifier 7 is switched to the EBAC control device 21, and a desired wiring portion is searched for by the EBAC image 22. After that, the output of the differential amplifier 7 is switched to the semiconductor parameter analyzer 8, switched to voltage map observation, and a detailed analysis is performed by a voltage map image 15. Accordingly, an abnormality in the wiring structure of the LSI device can be efficiently detected and analyzed.

Second Embodiment

FIG. 13 shows a fine-structured device characteristics evaluation system according to a second embodiment. This embodiment relates to a graphical user interface (GUI) of the fine-structured device characteristics evaluation system, and in order to analyze an electrical characteristic map image in detail, a part of the electrical characteristic map image is designated from the user interface, and a measurement value of the designated position is displayed as a graph. Accordingly, details of the focused position can be immediately known as numerical data, which helps to analyze an electrical phenomenon occurring in the sample.

Although not particularly limited, analysis data according to this embodiment is displayed on two screen monitors 10a, 10b. A linear mark 25 can be drawn on the GUI on the voltage map image 15 displayed on the monitor 10b. The information processing device 9 specifies a position designated by the mark 25 in the voltage map image 15, and displays a measurement value of the position as a graph 26 on the monitor 10a. The graph 26 displays the position designated by the mark 25 on a horizontal axis and the measurement value (a voltage value in this case) of the position on a vertical axis.

Third Embodiment

FIG. 14 shows a fine-structured device characteristics evaluation system according to a third embodiment. This embodiment also relates to a GUI of the fine-structured device characteristics evaluation system, enables electrical characteristic map observation to be performed on a plurality of samples, and arrangement and comparison of observation results (electrical characteristic map images). Further, a predetermined position of the electrical characteristic map image is designated from the user interface, and a measurement value of this portion is displayed as a graph.

Although not particularly limited, analysis data according to this embodiment is also displayed on the two screen monitors 10a, 10b. Dot-shaped marks 30a to 30d for designating positions to be compared by a user can be designated on the GUI on the voltage map images 15a to 15d displayed on the screen monitor 10b. The measurement value of the designated position is extracted from the database 11 for each sample. The monitor 10a shows a graph 31 on which a vertical axis represents the measurement value at the designated position (a voltage value in this case) and a horizontal axis represents a sample name to be compared.

Fourth Embodiment

FIG. 15 shows a fine-structured device characteristics evaluation system according to a fourth embodiment. In this embodiment, a current signal is acquired from the measurement probe 3, and a current map image 35 is created. An output of the measurement probe 3 is connected to the semiconductor parameter analyzer 8 through the measurement cable 13. Observation by a voltage map image is supposed to detect an abnormality in a small resistance wiring structure of an LSI device, while observation by a current map image is supposed to detect an abnormality in a PN junction of a semiconductor layer of the LSI device. Since measurement accuracy of a measurement device for parametric test of a general semiconductor device such as the semiconductor parameter analyzer 8 has sufficient accuracy for this application, the output from the measurement probe 3 is directly connected to the semiconductor parameter analyzer 8 in a measurement circuit according to this embodiment.

A measurement method for creating the current map image follows a flowchart in FIG. 2 (read a voltage signal as a current signal). This is because a high frequency random noise needs to be removed even in a case of current measurement, and a low frequency noise is present as shown in FIG. 4B and this effect needs to be removed.

A current distribution amount of the semiconductor layer can be observed by observing the current map image of the semiconductor layer with the fine-structured device characteristics evaluation system in FIG. 15. By comparing this with a semiconductor simulation or the like, a semiconductor structure such as a doping amount can be estimated.

Fifth Embodiment

FIG. 16 shows a fine-structured device characteristics evaluation system according to a fifth embodiment. This embodiment provides a fine-structured device characteristics evaluation system that creates a pulse response map image 41 as an electrical characteristic map image. An output of the measurement probe 3 is connected to an oscilloscope 40 through the measurement cable 13. The oscilloscope 40 is connected to the information processing device 9 through the communication cable 14.

In this embodiment, an incident electron beam to be radiated is incident at a predetermined interval and pulse width during radiation and non-radiation of the electron beam. The oscilloscope 40 measures a probe current 42 generated in a pulse shape by a pulse electron beam, measures a pulse rise time 43, and transmits the measured pulse rise time 43 to the information processing device 9 as numerical data. The information processing device 9 divides the pulse rise time 43 measured by the oscilloscope 40 into, for example, 256 gradations to determine a pixel value of each pixel, and creates the pulse response map image 41 as a numerical mapping image.

In the pulse response map image 41 shown in FIG. 16, an observed image of a wiring structure of an LSI device is schematically shown. A metal wiring portion is displayed in black since a pulse probe current rises rapidly, whereas an insulator layer portion is basically displayed in white. However, since a region 44 where metal wirings are close to each other has a capacitance component, a contrast corresponding to a magnitude of the capacitance component appears.

In this way, an inter-wiring capacitance that causes signal delay and noise can be observed by the pulse response map image 41. An abnormality from the contrast that appears in the pulse response map image can be analyzed by comparing a normal device sample with a failure device sample.

Although an example in which the rise time of a pulse current is measured as an electrical characteristic has been described here, a pulse response characteristic in response to radiation of the pulse electron beam can be widened and measured as the electrical characteristic. For example, an analysis on high frequency loss from a change in a pulse voltage value may be performed. In addition, the pulse width, a pulse current value and the like may be measured.

Sixth Embodiment

FIG. 17 shows a fine-structured device characteristics evaluation system according to a sixth embodiment. In this embodiment, a cross-sectional voltage map image is created.

Here, an example is shown in which a measurement sample is a sample 45 obtained by obliquely polishing a bare silicon wafer into which oxygen ions have been implanted. An electrode 46 for measuring an electrical characteristic from a back surface of the sample 45 is provided on a surface of the sample stage 6, and the sample 45 is placed on the electrode 46. When the measurement probe 3 is brought into contact with the electrode 46, a potential change of the back surface of the sample 45 can be measured by the semiconductor parameter analyzer 8. In this embodiment, an output of the measurement probe 3 is directly connected to the semiconductor parameter analyzer 8 through the measurement cable 13 in order to measure a large resistance sample called a bare silicon wafer. Although a differential amplifier is not used, measurement is performed according to the flowchart in FIG. 2 in order to remove an influence of a high frequency random noise and a low frequency noise. However, measurement accuracy is improved by sharing a reference potential of the vacuum chamber 4 and a reference potential of the semiconductor parameter analyzer 8.

A surface of the obliquely polished sample 45 is irradiated with an electron beam. A potential V1 is measured by the measurement probe 3 by irradiating an irradiation position P1 of the first electron beam with an electron beam. Subsequently, scanning is performed with an electron beam, and a potential V2 is measured by irradiating an irradiation position P2 with the electron beam. Here, a value obtained by subtracting the potential V1 from the potential V2 is a potential difference Vmap1 between a depth position Pd2 (a position of the irradiation position P2 in a depth direction) and a depth position Pd1, and the potential difference Vmap1 is stored in the database 11 together with position data (Pd1, Pd2). Next, a potential V3 is measured by irradiating an irradiation position P3 with an electron beam. A value obtained by subtracting the potential V2 from the potential V3 is a potential difference Vmap2 between the depth position Pd2 and a depth position Pd3, and the potential difference Vmap2 is stored in the database 11 together with position data (Pd2, Pd3). A similar operation is repeated along the obliquely polished surface. These electron beam scanning, potential measurement and depth position calculation are automatically performed. For example, the depth position can be calculated based on a horizontal distance between a polishing start position and the irradiation position of the electron beam, and an inclination angle of the polished surface.

The position data (Pd1, Pd2), (Pd2, Pd3) and the like stored in the database 11 indicate a depth of a silicon cross section, and a cross-section voltage map can be created by imaging the potential difference data Vmap1, Vmap2 and the like corresponding to this position as a grayscale display.

Seventh Embodiment

FIG. 18 shows a fine-structured device characteristics evaluation system according to a seventh embodiment. In this embodiment, a simulator is used in combination. Different portions can be estimated as failure portions by comparing an electrical characteristic map image with a simulation image obtained by simulation for the electrical characteristic. FIG. 18 shows an example in which a voltage map image is created as the electrical characteristic map image, and a configuration of a measurement circuit of the fine-structured device characteristics evaluation system is the same as that in FIG. 1. The measurement circuit can be configured according to the electrical characteristic for creating the electrical characteristic map image. Although an example of the semiconductor parameter analyzer 8 is shown as an example of a measurement device used for measuring the electrical characteristic, an oscilloscope, an impedance analyzer, an LCR meter or the like can be used according to the electrical characteristic to be measured.

Since a high calculation load is generally generated in the simulation, the information processing device 9 according to this embodiment enables parallel processing calculation by a graphics processing unit (GPU). A parallel processing function of the GPU is used to perform two-dimensional simulation of voltage mapping expected from a structure of a measurement sample and to perform data collection and image processing for creating the voltage map image. In this case, a part of a processor of the GPU is reserved for voltage measurement and voltage map image creation and display. On the other hand, in order to theoretically know what kind of voltage map image is displayed in parallel with the measurement, the structure of the measurement sample 5 is used as a simulation model, and a voltage generated when an electron beam is incident on the structure is calculated for each position on a sample surface.

The voltage map image 15 obtained by actual measurement of the measurement sample 5 is displayed on the monitor 10b, a simulation image 50 predicted by the above-described simulation is displayed on the monitor 10a, and presence or absence of an abnormality can be estimated by comparing the two. In other embodiments, that is, regardless of use of the simulator in combination, application of the information processing device 9 capable of performing parallel processing and calculation processing by the GPU is effective since a calculation load is large in creation of the electrical characteristic map image.

Eighth Embodiment

FIG. 19 shows a fine-structured device characteristics evaluation system according to an eighth embodiment. In this embodiment, the measurement probe 3 is automatically brought into contact with a plurality of contacts on a sample surface, and electrical characteristic mapping measurement (for example, voltage mapping measurement) of a plurality of wiring structures is automatically enabled. A configuration of the fine-structured device characteristics evaluation system is the same as that in FIG. 1 in a case of performing the voltage mapping measurement. In order to perform automatic measurement, the information processing device 9 controls a drive device of the measurement probe 3 such that the measurement probe 3 is moved onto and brought into contact with a desired contact. A probing position setting operation in the eighth embodiment will be described with reference to FIG. 19.

FIG. 19 shows a state where three contacts 55a to 55c are formed on a surface of the sample 5, and the measurement probe 3a is in contact with the first contact 55a and the measurement probe 3b is in contact with the third contact 55c. The automatic measurement assumes a case where after the electrical characteristic mapping measurement is performed by bringing the measurement probes into contact with the contacts 55a, 55c, the electrical characteristic mapping measurement is performed when the measurement probe 3a is moved to the contact 55b and the measurement probes are brought into contact with the contacts 55b, 55c. The information processing device 9 sets three-dimensional virtual coordinates 56 in X, Y, Z directions, and controls movement of the measurement probe 3 according to the virtual coordinates 56.

The virtual coordinates in the X direction and the Y direction of the virtual coordinates 56 are set based on an SEM image acquired by the fine-structured device characteristics evaluation system (details thereof will be described later as an eleventh embodiment). For convenience of description, FIG. 19 shows a state where the virtual coordinates in the X, Y directions and the virtual coordinates in the Z direction set by the information processing device 9 are superimposed on the measurement sample 5. The virtual coordinates in the X, Y directions can be appropriately set in the SEM image, and in the example in FIG. 19, position coordinates of the first contact 55a are (0, 0), and position coordinates of the second contact 55b as a movement destination are (7, 5).

On the other hand, the measurement probe 3 can obtain an appropriate contact by bringing a tip having elasticity into contact with the contact 55 at a predetermined contact pressure. Therefore, in order to move to a contact to come into contact with, it is necessary to move the tip in the Z direction until the tip is once completely separated from the contact (pull up), and then move in the (X, Y) directions and again in the Z direction so as to contact the destination contact at the predetermined contact pressure (pull down). Therefore, it is necessary to know a drive amount in the Z direction by the drive device from a state of appropriately contacting the contact to a state of being completely separated, and this is specified by a scale of virtual coordinates in the Z direction.

Specifically, first, in a state where the measurement probe 3 is in contact with the contacts 55a, 55c, the measurement sample 5 is irradiated with an electron beam to measure a voltage. Next, the measurement probe 3a is pulled up in the Z direction while the electron beam is radiated. It is assumed that the measured voltage is 0 on a scale 5 in the Z direction. In this case, the information processing device 9 can control contact and non-contact of the measurement probe 3 with the contact 55 by driving the drive device so as to raise and lower the measurement probe 3 by five scales. Here, the scale in the Z direction can be implemented, for example, by equally dividing a drive time of the measurement probe 3 in the Z direction at any time and virtually associating this time interval as the scale in the Z direction. For example, one scale in the Z direction can be set as driving of the measurement probe 3 in the Z direction for 5 seconds by the drive device.

By using virtual coordinates to designate positions of a plurality of contacts, the information processing device 9 sequentially moves the measurement probe 3 automatically toward designated virtual coordinates (X, Y), and the measurement probe 3 is brought into contact with the measurement sample 5, whereby the measurer can perform automatic measurement. Accordingly, the information processing device 9 can display a voltage map image palpated at a plurality of places on the monitor, and can obtain high measurement throughput.

The virtual coordinates according to this embodiment can be used not only for setting a probing position but also for setting an irradiation position of the electron beam.

Ninth Embodiment

FIG. 20 shows a fine-structured device characteristics evaluation system according to a ninth embodiment. This embodiment enables a cooperative analysis with a dynamic EBAC image obtained by allowing a pulse electron beam to be incident in the fine-structured device characteristics evaluation system described as the fifth embodiment. The fine-structured device characteristics evaluation system according to this embodiment includes an EBAC control device 21 that acquires a dynamic EBAC image 62. An output of the measurement probe 3 is input to the EBAC control device 21 or the oscilloscope 40 by a switch 60. A voltage amplifier 61 that amplifies the output of the measurement probe 3 is provided between the switch 60 and the EBAC control device 21.

The pulse electron beam is radiated to the measurement sample 5, and the EBAC control device 21 measures an absorbed current amount in synchronization with the pulse electron beam and creates an EBAC image based on the absorption current amount measured by the information processing device 9, whereby the dynamic EBAC image that reflects a capacitance component in the measurement sample can be obtained. Since EBAC observation enables high-speed observation of a wide range of a sample surface, a dynamic EBAC analysis is used to confirm approximate abnormal positions. For electrical characteristic mapping measurement that needs time for measurement processing, a measurement region is narrowed down and the pulse response map image 41 is created and analyzed, thereby efficiently performing abnormality detection and analysis.

Tenth Embodiment

FIG. 21 shows a fine-structured device characteristics evaluation system according to a tenth embodiment. In this embodiment, a voltage signal is applied to the measurement sample 5 from a probe different from a probe that acquires an electrical characteristic map image, and a voltage contrast image 66 and the electrical characteristic map (voltage map) image obtained at this time can be compared with each other. Here, in order to obtain the voltage contrast image, the signal applied to the probe is not limited to a static DC signal, and is not limited in terms of signal form such as a dynamic high frequency signal.

The measurement probe 3 is connected to the semiconductor parameter analyzer 8 through a voltage signal application cable 65 and the measurement cable 13. The voltage signal application cable 65 is merely functionally distinguished from the measurement cable 13, and is a cable that transmits an analog signal. The same cable as the measurement cable 13 may be used.

A predetermined voltage signal is applied to the measurement sample 5 from the semiconductor parameter analyzer 8 through the measurement probe 3a. The information processing device 9 creates the voltage contrast image 66 based on a detection signal from the detector 2. On the other hand, an output voltage from the measurement probe 3b is measured by the semiconductor parameter analyzer 8 to create a voltage map image. A measurement method for creating the voltage map image follows the flow in FIG. 2, but an example in FIG. 21 has a purpose of detecting and analyzing a defect such as an open failure, and the obtained signal is relatively large. Therefore, the semiconductor parameter analyzer 8 measures the output voltage from the measurement probe 3b directly without amplification by a differential amplifier as in the fine-structured device characteristics evaluation system in FIG. 1.

Eleventh Embodiment

FIGS. 22 and 23 show a fine-structured device characteristics evaluation system according to an eleventh embodiment. In this embodiment, a method of setting virtual coordinates in electrical characteristic mapping measurement will be described. In the first embodiment, the ninth embodiment and the tenth embodiment, examples of performing a collaborative analysis with another evaluation method have been described. In such a cooperative analysis, an image obtained by another evaluation method may be desired to be compared with an electrical characteristic map image, and when a positional relationship cannot be matched at this time, it is difficult to compare and collate results obtained by a plurality of evaluation methods. Alternatively, the positional relationship needs to be matched in order to specify a measurement region from an image obtained by another evaluation method and create the electrical characteristic map image. In the second embodiment (see FIG. 13), a region is designated and a measurement value is graphed in the electrical characteristic map image. However, a GUI is also conceivable in which a region is specified from an SEM image or an image obtained by another evaluation method, for example, an EBAC image, so that an electrical characteristic is measured and the measurement value is graphed. Therefore, in the eleventh embodiment, the information processing device 9 uses the SEM image created based on a detection signal from the detector 2 as a reference to match the positional relationship with various electrical characteristic map images, the EBAC image and a voltage contrast image. The SEM image is used as a reference since a structure of a sample is shown in detail in the SEM image, and it is easy to set a reference position for setting the virtual coordinates. A configuration of the fine-structured device characteristics evaluation system is similar to that in FIG. 1, but a measurement circuit is configured according to electrical characteristics to be measured and an evaluation method to be applied.

FIG. 22 shows an example of an SEM image 70 acquired by the fine-structured device characteristics evaluation system. A visual field of the SEM image is set according to a region to be evaluated. In this example, two wirings 71, 72 can be observed on a sample surface. Therefore, three positions of corners of the wirings 71, 72 are respectively aligned with a first marker 73, a second marker 74 and a third marker 75, and are registered in the information processing device 9 as reference positions. Since a marker serves as a reference for the virtual two-dimensional coordinates as will be described later, at least three markers are required, and it is desirable to set marker positions in the SEM image 70 at positions as away from each other as possible. In this example, the marker is set using the corner of the wiring as a mark, but the structure of the sample used as the mark is not limited to the wiring. The structure of the sample is not limited to the structure of the sample, and may be a foreign substance. Shapes of the markers 73 to 75 are not limited to those shown in the drawing.

Next, the virtual coordinates (X, Y) are set. For example, as shown in FIG. 23, virtual two-dimensional coordinates 76 are set by the information processing device 9 with the first marker 73 as an origin (0, 0). Based on the virtual coordinates set based on this SEM image, the EBAC image and the electrical characteristic map image are associated with the positional relationship.

In a case where imaging conditions are not changed, specifically, the visual field or a magnification is not changed, a range in which the electron beam is operated is the same as that when the SEM image is created. Therefore, a positional relationship of the sample surface based on the virtual two-dimensional coordinates 76 created from the SEM image can be shared as the same in both the EBAC image and the electrical characteristic map image. On the other hand, when the visual field or the magnification is changed, positions of the EBAC image and the electrical characteristic map image corresponding to positions designated by the virtual coordinates of the EBAC image and the electrical characteristic map image can be specified by converting coordinates of the virtual coordinates, based on the imaging conditions (electron beam deflection control amount, magnification change amount and the like) when the SEM image is acquired and when the EBAC image or the electrical characteristic map image is acquired. Accordingly, for example, when measurement data on the electrical characteristic map image corresponding to a position designated in the EBAC image is desired to be obtained, the position designated in the EBAC image is converted into a position on the virtual coordinates, and the position on the electrical characteristic map image is specified by the virtual coordinates, whereby the measurement value can be obtained.

The invention has been described above using a plurality of embodiments. The invention is not limited to the above embodiments, and includes various modifications. For example, the above embodiments have been described for easy understanding of the invention, and the invention is not necessarily limited to those including all configurations described above. Apart of a configuration of one embodiment can be replaced with a configuration of another embodiment, and a configuration of another embodiment can be added to a configuration of one embodiment. A part of the configuration of each embodiment may be added to, deleted from or replaced with the configuration of another configuration.

REFERENCE SIGN LIST 1 electron optical system, 2 detector, 3 measurement probe, 4 vacuum chamber, 5 measurement sample, 6 sample stage, 7 differential amplifier, 8 semiconductor parameter analyzer, 9 information processing device, 10 monitor, 11 database, 12 control device, 13 measurement cable, 14 communication cable, 15 voltage map image, 21 EBAC control device, 22 EBAC image, 40 oscilloscope, 41 pulse response map image, 50 simulation image, 55 contact, 56 virtual coordinate, 62 dynamic EBAC image, 65 voltage signal application cable, 66 voltage contrast image, 70 SEM image, 71, 72 wiring, 73, 74, 75 marker, 76 virtual two-dimensional coordinate.

The invention claimed is:

1. A semiconductor inspection device comprising:
a sample stage on which a sample is placed;
an electron optical system configured to radiate an electron beam to the sample;
a measurement probe configured to come into contact with the sample;
a measurement device configured to measure an output from the measurement probe; and
an information processing device configured to acquire a measurement value of the output from the measurement probe in response to radiation of the electron beam to the sample, wherein
the information processing device
sets a timing to start the radiation of the electron beam to the sample and a timing to freeze the radiation of the electron beam, a first measurement period in which the measurement device measures the output from the measurement probe in a state where the electron beam is radiated to the sample, and a second measurement period in which the measurement device measures the output from the measurement probe after the radiation of the electron beam is frozen, and
obtains the measurement value of the output from the measurement probe in response to the radiation of the electron beam to the sample from a difference between a first measurement value measured in the first measurement period and a second measurement value measured in the second measurement period.

2. The semiconductor inspection device according to claim 1, wherein
the information processing device detects a time change of the output from the measurement probe when the electron beam is radiated to the sample, and sets the first measurement period and the second measurement period to be included in a time period in which the time change is small.

3. The semiconductor inspection device according to claim 2, wherein
the first measurement value is a value obtained by integrating measurement values measured by the measurement device in the first measurement period, and the second measurement value is a value obtained by integrating measurement values measured by the measurement device in the second measurement period.

4. The semiconductor inspection device according to claim 3, wherein
the measurement device measures a voltage signal generated in the measurement probe in response to the radiation of the electron beam.

5. The semiconductor inspection device according to claim 3, further comprising:
a first measurement probe and a second measurement probe configured to come into contact with the sample; and
a differential amplifier in which an output from the first measurement probe is connected to a first input terminal, and an output from the second measurement probe is connected to a second input terminal, wherein
the measurement device measures a voltage signal output from the differential amplifier.

6. The semiconductor inspection device according to claim 5, wherein
the information processing device controls a gain of the differential amplifier.

7. The semiconductor inspection device according to claim 3, wherein
the measurement device measures a current signal generated in the measurement probe in response to the radiation of the electron beam.

8. The semiconductor inspection device according to claim 3, wherein
the electron optical system scans the sample two-dimensionally, and
the information processing device stores the measurement value of the output from the measurement probe in response to the radiation of the electron beam in association with an irradiation position of the electron beam.

9. The semiconductor inspection device according to claim 8, wherein
the information processing device creates a numerical mapping image in which a pixel value of a pixel corresponding to the irradiation position of the electron beam is determined based on the measurement value of the output from the measurement probe in response to the radiation of the electron beam.

10. The semiconductor inspection device according to claim 8, further comprising:
a detector configured to detect signal electrons emitted by interaction between the electron beam and the sample, wherein
the information processing device creates an SEM image from a signal detected by the detector and sets virtual coordinates based on the SEM image.

11. The semiconductor inspection device according to claim 10, wherein
the information processing device moves the measurement probe to a position designated by the virtual coordinates.

12. The semiconductor inspection device according to claim 1, further comprising:
a detector configured to detect signal electrons emitted by interaction between the electron beam and the sample; wherein
the electron optical system scans the sample two-dimensionally according to a first imaging condition, and the information processing device creates an SEM image from a signal detected by the detector and sets virtual coordinates based on the SEM image,
the electron optical system scans the sample two-dimensionally according to a second imaging condition, and the information processing device creates an electrical characteristic map image based on the measurement value of the output from the measurement probe measured by the measurement device, and
the information processing device specifies a position designated by the virtual coordinates on the electrical characteristic map image by performing coordinate conversion on the virtual coordinates based on the first imaging condition and the second imaging condition.

13. The semiconductor inspection device according to claim 12, wherein
the information processing device determines a pixel value of the electrical characteristic map image based on the measurement value of the output from the measurement probe in response to the radiation of the electron beam to a position corresponding to a pixel of the electrical characteristic map image.

14. The semiconductor inspection device according to claim 12, further comprising:

an electron beam absorbed current (EBAC) control device configured to output a signal indicating an absorbed current amount at an irradiation position of the electron beam based on the output from the measurement probe in response to the radiation of the electron beam, wherein the electron optical system scans the sample two-dimensionally according to a third imaging condition, and by creating an EBAC image from the signal output from the EBAC control device and performing coordinate conversion on the virtual coordinates based on the first imaging condition and the third imaging condition, the information processing device converts a position on the EBAC image into a position on the virtual coordinates.

15. The semiconductor inspection device according to claim 12, wherein the measurement value of the output from the measurement probe measured by the measurement device is a voltage value or a current value.

16. The semiconductor inspection device according to claim 12, wherein the electron optical system radiates a pulse electron beam to the sample, and the measurement value of the output from the measurement probe measured by the measurement device is a pulse response characteristic.

17. The semiconductor inspection device according to claim 16, further comprising:

an electron beam absorbed current (EBAC) control device configured to output a signal indicating an absorbed current amount at an irradiation position of the pulse electron beam, in synchronization with the pulse electron beam, based on an output from the measurement probe in response to radiation of the pulse electron beam, wherein the electron optical system scans the sample two-dimensionally according to a fourth imaging condition, and by creating a dynamic EBAC image from the signal output from the EBAC control device and performing coordinate conversion on the virtual coordinates based on the first imaging condition and the fourth imaging condition, the information processing device converts a position on the dynamic EBAC image into a position on the virtual coordinates.

* * * * *